(12) United States Patent
Cheng

(10) Patent No.: US 6,618,846 B2
(45) Date of Patent: Sep. 9, 2003

(54) ESTIMATING CAPACITANCE EFFECTS IN INTEGRATED CIRCUITS USING CONGESTION ESTIMATIONS

(75) Inventor: Chih-liang Cheng, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/944,885

(22) Filed: Aug. 31, 2001

(65) Prior Publication Data

US 2003/0051217 A1 Mar. 13, 2003

(51) Int. Cl.[7] ............................................. G06F 17/50
(52) U.S. Cl. ..................... 716/5; 716/9; 716/8; 716/11; 716/13
(58) Field of Search ....................................... 716/1–21

(56) References Cited

U.S. PATENT DOCUMENTS

| 5,587,923 | A | | 12/1996 | Wang |
| 5,798,936 | A | | 8/1998 | Cheng |
| 5,831,870 | A | * | 11/1998 | Folta et al. ..................... 716/5 |
| 5,847,965 | A | | 12/1998 | Cheng |
| 6,175,947 | B1 | * | 1/2001 | Ponnapalli et al. ............ 716/5 |
| 6,327,693 | B1 | * | 12/2001 | Cheng et al. .................. 716/12 |
| 6,415,422 | B1 | * | 7/2002 | Mehrotra et al. ............... 716/5 |

OTHER PUBLICATIONS

Maogang Wang, Xiaojian Yang, Majid Sarrafzadeh, "Congestion Minimization During Placement", *IEEE Transactions on Automatic Control, vol. XX, No. Y. Month 1999*, pps. 100–109.

Joseph L. Ganley, "Computing Optimal Rectilinear Steiner Trees: A Survey and Experimental Evaluation", *Cadence Design Systems, Inc.* 2615 John Milton Drive, Oak Hill, Virginia 20171, Preprint submitted to Elsevier Science, pps. 1–13, Feb. 17, 1998.

(List continued on next page.)

*Primary Examiner*—Matthew Smith
*Assistant Examiner*—Magid Dimyan
(74) *Attorney, Agent, or Firm*—Silicon Valley Patent Group LLP

(57) ABSTRACT

A method estimates the capacitance effects of an interconnect prior to routing of an integrated circuit (IC) design, as follows. The design is divided into areas. Capacitance effects for each area are estimated based on the congestion ratios within the area. The congestion ratios for each area are derived from estimations of the demand for routing resources in each area for each net in the net-list included in the IC design. Coupling vectors are derived for each area from the congestion ratios. Capacitance effects for each area are then estimated by looking up a database using the coupling vectors. The resulting per-area capacitance effects are then used to estimate capacitance in an interconnect traversing the area. The total capacitance effects due to an interconnect traversing multiple areas is determined by applying the per-area capacitance effects for the areas to the dimensions of portions of the interconnect traversing each of the areas.

24 Claims, 13 Drawing Sheets

OTHER PUBLICATIONS

"Fast Congestion Prediction by Rent's Rule", 5 pps.

Moagang Wang, Xiaojian Yang, Majid Sarrafzadeh, "Multi-Center Congestion Estimation and Minimization During Placement", *Department of Electrical and Computer Engineering, Northwestern University*, Evanston, IL 60208, 6 pps.

Ion I. Măndoiu, Vijay V. Vazirani, Joseph L. Ganley, "A New Heuristic for Rectilinear Steiner Trees", *Supported by NSF Grant CCR 9627308*, pps. 1–6.

Gabriel Robins and Alexander Zelikovsky "Improved Steiner Tree Approximation in Graphs", *Department of Computer Science, University of Virginia and Georgia State University, Supported in part by a Packard Foundation Fellowship, and by a GSU Resarch Initiation Grant*, pps. 1–11.

Jason Cong, Lei He, Cheng–Kok Koh and Patrick H. Madden, "Performance Optimization of VLSI Interconnect Layout", *Department of Computer Science, University of California*, Los Angeles, CA 90095, pps. 1–99.

* cited by examiner

US 6,618,846 B2

ESTIMATING CAPACITANCE EFFECTS IN INTEGRATED CIRCUITS USING CONGESTION ESTIMATIONS

BACKGROUND

Throughout the 1990's to the present, IC design and fabrication has progressed to smaller and smaller scales. Recent developments, for example, include the design of "systems on a chip," or "SoCs," using VDSM ("Very Deep Submicron") technology. At VDSM dimensions, IC device sizes smaller than 0.25 microns (the sub-micron level, where one micron is one-millionth of a meter) are achieved. At such VDSM levels of integration, a number of design complexities arise. One of these is the well-known timing problems caused by capacitance effects generated within closely located conductive wires (hereafter, "interconnects") interconnecting the semiconductor devices (hereafter, "devices") constituting the integrated circuit. By way of background, a typical IC chip includes a semiconductor substrate containing upwards of a million devices of varying sizes (some devices of VDSM dimensions); the devices are in turn connected by interconnects running in metal layers layered atop the semiconductor substrate. A "metal layer structure" as used herein refers to the structure of metal layers 50 (FIG. 1) within which the interconnects are to be routed to connect the devices embedded in the semiconductor substrate. Interconnects are typically routed parallel to one another within each metal layer as illustrated in FIG. 1, although other configuration are sometimes used. In many common metal layer structures, the direction of the interconnects in adjacent layers is orthogonal. In addition, typical IC chips include a conductive substrate layer beneath the semiconductor substrate opposite to the metal layer structure that operates as a ground plane, as described next.

In FIG. 1, a typical metal layer structure 50 having five metal layers is illustrated. (It should be noted that different IC designs may employ differently configured metal layer structures—e.g., a three-metal layer structure where interconnects are routed in the same track direction for each metal layer, or a six-metal layer structure where a single layer includes interconnects routed orthogonally to the interconnects in the other five layers.) As shown in FIG. 1, five metal layers 50—including layers M1, M2, M3, M4 and M5 respectively—are shown consecutively layered atop semiconductor substrate 54 (note that a ground plane beneath semiconductor substrate 54 is not shown). It should also be noted that the illustration in FIG. 1 is an abstraction, and that many tracks in the lower metal layers, e.g., M1 and M2, may actually be unavailable for routing due to blockages caused by macrocells (i.e., large logic devices such as a CPU) protruding from the semiconductor substrate 54. Each metal layer M1 through M5 includes a set of parallel routing tracks that are illustrated as the dotted lines in M1-T through M5-T. M1-T through M5-T provide a top view of the parallel track structures (dotted lines) in metal layers M1 through M5. (Some metal layer structures may have non-parallel routing tracks, and certain embodiments of the invention described below are not intended to be limited to any particular configuration of the routing tracks.) Thus, the routing tracks (M1-T for metal layer M1 include routing track 56 running in a horizontal direction relative to the reader, when the reader views metal layer M1 in the direction D (which is perpendicular to a plane of layer M1). Likewise, the routing tracks for M2-T include routing track 58 running in a vertical direction relative to the reader (i.e., orthogonal to the routing tracks in layers M1 and M3). For purposes of this disclosure, metal layers will also be referred herein as "horizontal metal layers" or "vertical metal layers" depending on the routing track direction relative to the reader, unless otherwise noted.

Capacitance effects on a single interconnect 26 within a typical metal layer structure 18 may arise from a number of adjacent interconnects, as illustrated in FIG. 2. In FIG. 2, metal layer structure 18 includes a ground plane 36, first metal layer M1, second metal layer M2, third metal layer M3, and fourth metal layer M4. (Note that the semiconductor device layer is not shown but is normally placed between ground plane 36 and first metal layer M1). M1 in turn includes interconnects 32 and 34; M2 includes interconnect 30 running orthogonal to interconnects 32 and 34 in M1; M3 includes interconnects 24, 26 and 28 running orthogonal to interconnect 30; and M4 includes interconnect 22 running orthogonal to interconnects 24, 26 and 28, and parallel to, for example, interconnect 30 in M2. It should be noted that such prior art metal layer structures 18 may be varied in terms of interconnect direction (e.g., interconnects may run diagonally or otherwise in a metal layer), number of metal layers (e.g., two to eight layers), the order of metal layers (e.g., adjacent layers may have the same interconnect direction), and the number and location of ground planes (the first or a second ground plane may be located between metal layers three and four).

As illustrated in FIG. 2, capacitance effects felt by interconnect 26 are shown by arrows, e.g., arrows 38, 40 and 42 (other arrows are also shown but not labeled, and arrow 46 illustrates the capacitance effects generated between interconnect 24 and 28). As shown, capacitance effects are generated within interconnect 26 by its neighboring interconnects 22, 24, 26, 28, 32, 34 and 36, and the ground plane 36; the effects of capacitance flow in two directions (as illustrated by the arrows drawn as double-headed arrows), and thus interconnect 26 also causes capacitance effects on its neighboring interconnects 22, 24, 26, 28, 32 and 34. The interconnects surrounding a given interconnect, e.g. 26, whether a parallel interconnect in the same metal layer, e.g., 28 and 24 in M3, or an orthogonal interconnect in a different metal layer, e.g. 22 and 30 in M4 and M3 respectively, will be referred to as neighboring interconnects for purposes of this disclosure. In general, the effects of capacitance may be estimated as a function of the distance (among other things) between neighboring interconnects, and therefore increased integration—causing the interconnects to be routed in closer proximity to one another—increases the capacitance effects between the neighboring interconnects. Depending on how signals are transmitted within the neighboring interconnects at a given moment in time, the capacitance effects on a given interconnect may either delay or accelerate the signal carried by it. In a worst case scenario, the arrangement of interconnects in a particular metal layer structure may cause signals to be delayed beyond acceptable timing thresholds, resulting in arbitrary and recurrent chip malfunction.

Two prior art techniques for estimating capacitance are currently prevalent. In one technique, the IC designer relies upon his or her accumulated experience to estimate the potential capacitance effects in each new layout. Applicant notes that this method lacks accuracy because, for example, two layouts are typically different both in architecture and in scale of integration (IC designs tend to progress to smaller scales of integration). In another technique, a layout is first completely routed, then analyzed for capacitance effects to retrieve relevant statistical data for optimizing the layout in a second routing iteration. Applicant notes that this method has the drawback of requiring the layout to be routed at least twice. In addition, Applicant notes that in typical applications, the prior art techniques use a single measure of capacitance to estimate capacitance for the entire design.

SUMMARY

In accordance with the present invention, a measure of congestion between interconnects of an integrated circuit (IC) chip being designed is estimated prior to routing of the interconnects through the chip. The estimated congestion for a portion of the chip is then used to derive an estimate of the capacitance effects caused in the portion by the presence of the interconnects. The capacitance effects are estimated as a function of the direction, the length, and/or the number of interconnects that are expected to traverse the portion. In some embodiments of the present invention, the estimate of capacitance effects is then used to optimize the placement of logical devices in a layout of the IC chip.

DETAILED DESCRIPTION

Figure 1:
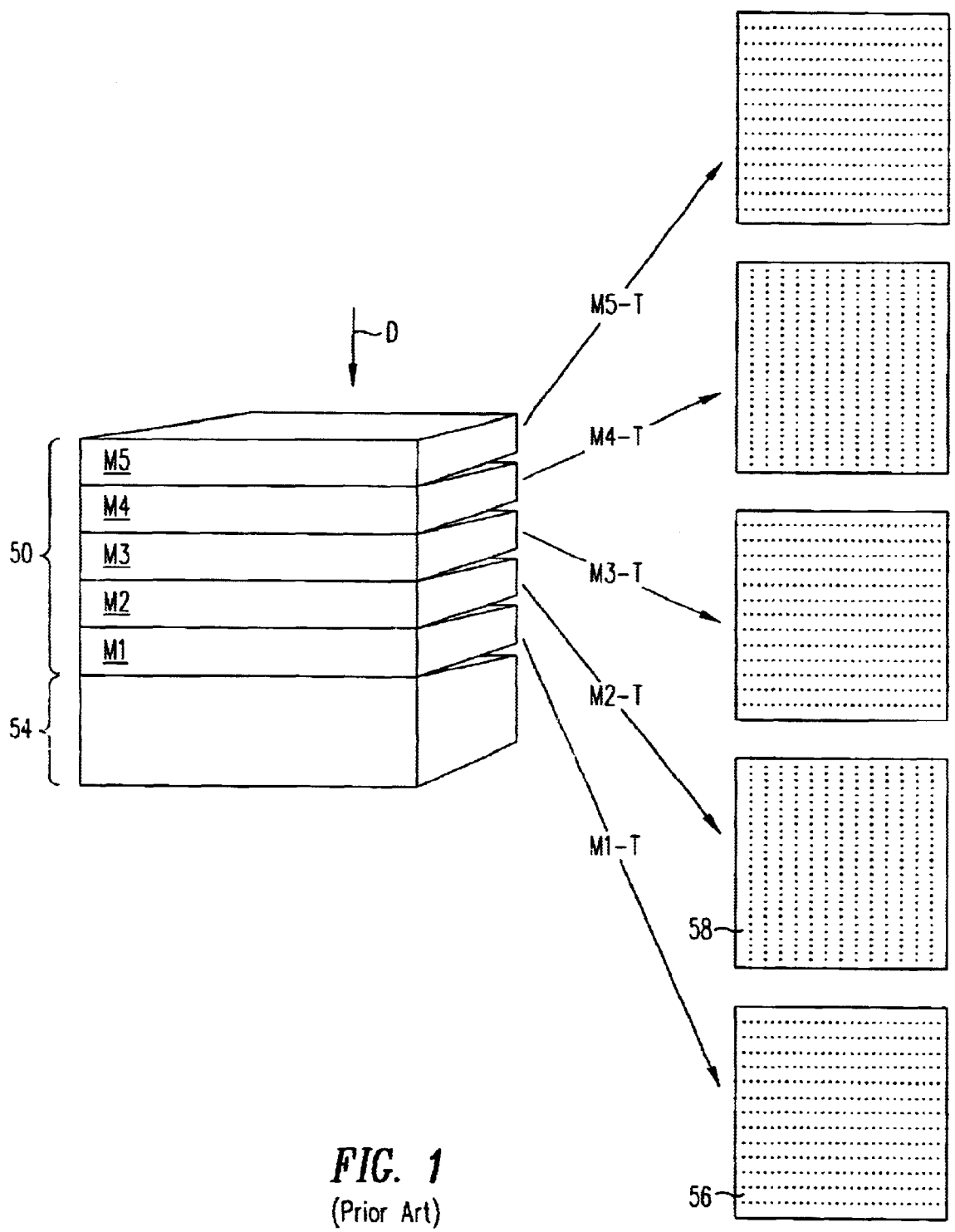
FIG. 1 is a block diagram illustrating an exemplary metal layer structure 50 for an IC design of the prior art.
Figure 2:
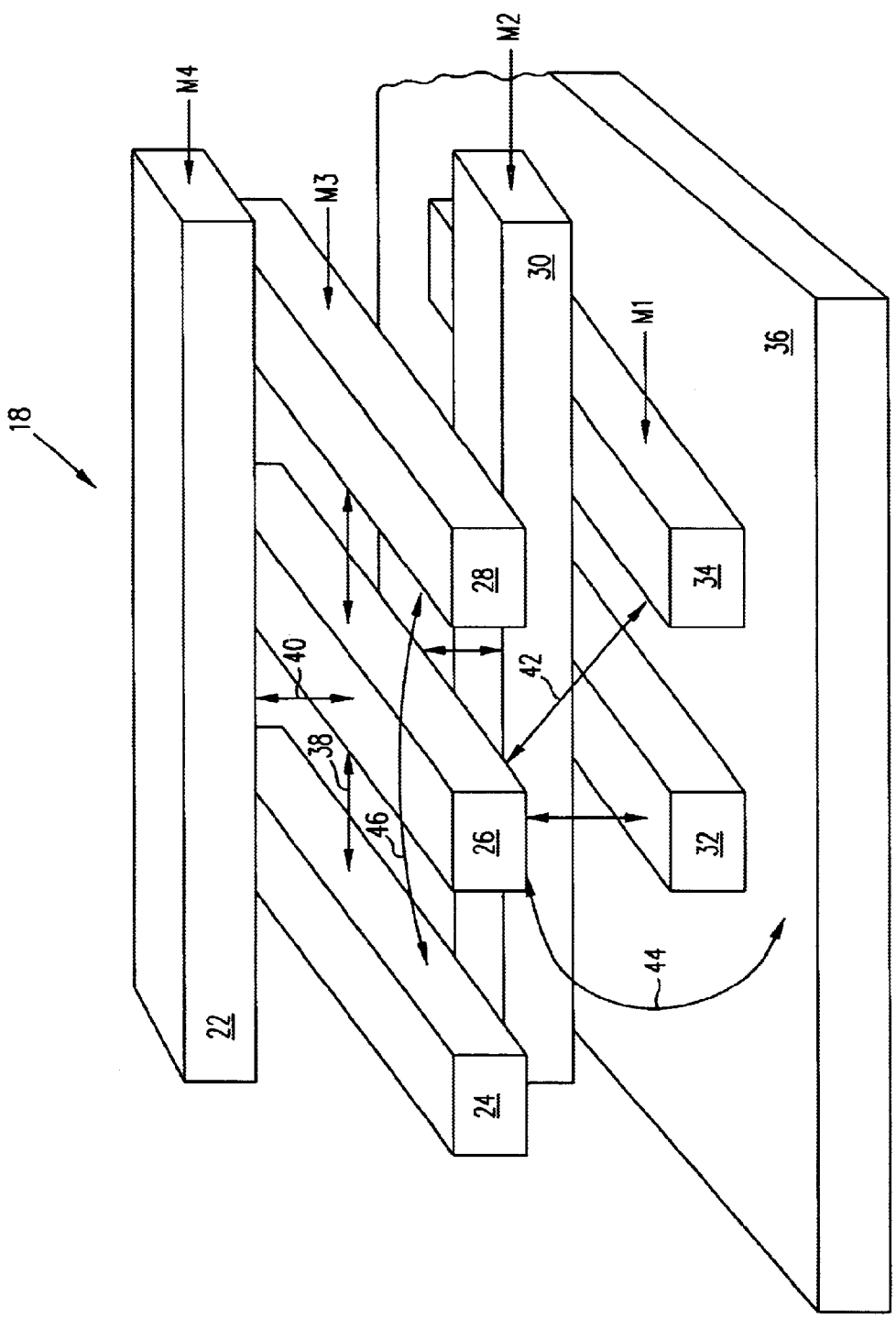
FIG. 2 is a block diagram of the prior art illustrating the capacitance effects on a single interconnect 26 within a typical metal layer structure 18.

An "IC layout" for purposes of this disclosure refers generally to a computer-aided design of an integrated circuit. At the pre-routing stage relevant to this disclosure, the IC layout typically includes the proposed placement (location) of the semiconductor devices (hereafter "devices") on the IC semiconductor substrate, but not the actual manner in which the devices will be interconnected in the IC chip (i.e., in what tracks the router will route wires connecting the connective pins of the devices). Accordingly, the pre-routing IC layout typically includes a list of the devices in the IC design, a list of which connective pins belonging to the devices are interconnected (defining a "net"), and the placement of the devices (and their respective connective pins) on the IC semiconductor substrate. How the nets are actually routed (e.g., the length, direction and size of the interconnects as well as the metal layers used for routing the interconnects) is typically unknown at the pre-routing design stage. During the routing stage, the router uses a real-time routing algorithm that is generally too computationally intensive to run during the pre-routing stage. During the pre-routing stage, the IC layout may be optimized to preclude implementation failures arising during actual routing, e.g. by use of capacitance effects to change the placement of semiconductor devices prior to routing for purposes of avoiding timing anomalies caused by excessive concentration of capacitance effects generated by the interconnects.

Capacitance effects are estimated in certain embodiments of the present invention prior to the actual routing of a layout, using estimates of routing congestion of the to-be-routed interconnects. The congestion of such interconnects (for use in determining capacitance effects as described herein) may be estimated in any manner well known in the art, depending on the embodiment. For example, congestion may be estimated when a layout is optimized to avoid design placements that are not routable, or are inefficiently routable, due to an insufficient supply of interconnect resources in portions of the metal layer structure.

Although congestion problems may be solved by increasing the physical dimensions of the chip and/or the metal layer structure (adding metal layers)—thereby making additional interconnects available per unit area of the layout—this solution is generally undesirable because of the increased costs of producing larger-sized IC chips. Thus, typical prior art IC design tools enable congestion issues to be identified and avoided by appropriate placement of semiconductor devices during the pre-routing stage. See, for example, U.S. Pat. Nos. 5,847,965 and 5,798,936 that are incorporated by reference herein in their entirety. Interconnect congestion may be estimated as described in, for example, U.S. Pat. No. 5,587,923 that is also incorporated by reference herein in its entirety.

Interconnect congestion may also be estimated on a per unit area basis as distributed over a metal layer structure, as done by, e.g., the "Apollo" tool produced by Avant! Corporation of Fremont, Calif. For example, depending on the placement, a concentration of devices (and therefore connective pins) may be distributed over only certain portions of the IC chip. At these concentrated locations, the number of interconnects needed to connect the connective pins may exceed the available supply of interconnects supported by the metal layer structure; as used herein, the number of interconnects needed per unit area of the layout shall also be referred to as the "routing resource demand." Routing resource demand may be measured in terms of tracks per unit area of layout; a track is a pre-determined line (also called "wire") in a metal layer structure along which a router is designed to route an interconnect. As used herein, "routing resource supply" shall refer to the number of tracks—and therefore interconnects—available to the router for routing; routing resource supply is typically measured on a per unit area basis over the metal layer structure.

In congestion estimation, the layout may be optimized to avoid congestion issues by adjusting the placement of the devices (and connective pins) so that concentrations of routing resource demand—especially in areas of relatively smaller supplies—may be re-distributed to less congested areas in the metal layer structure. A graphical representation of relative congestion distributed over the layout generated by an IC design tool may be used to obtain a congestion ratio per unit area of the layout (given a particular metal layer structure). As used herein, "congestion ratio" refers to the ratio of routing resource demanded by the layout divided by routing resource supplied in the metal layer structure on a per unit area basis. Such capacitance estimates may be used to optimize placement of devices in an IC layout.

So, any congestion estimation technique may be used in accordance with the invention to provide an efficient mechanism for estimating capacitance effects. Accordingly, in some embodiments of the present invention, a method and system for estimating capacitance effects is based on congestion estimation techniques of the prior art. An advantage provided by these embodiments is that existing congestion estimation technologies normally used for solving congestion problems are additionally used to solve timing problems caused by capacitance. In these embodiments, the resulting per-area congestion estimates obtained using congestion estimation techniques are in turn used to generate estimations of capacitance effects in corresponding areas in the interconnect structure.

In some embodiments of the present invention, a congestion map is created by individually estimating the congestion for all (or substantially all) portions of an IC chip. In such embodiments, the congestion map may include several portions (hereafter "grids") which together cover (or substantially cover) the surface of an interconnect structure; the estimate of congestion for each grid therefore provides a measure of the interconnect congestion in the metal layers of the interconnect structure below the grid and defined by the edges of the grid. In some embodiments, each grid covers a rectangular portion of the interconnect structure. Each such grid is defined by the intersection of a row and a column within a number of parallel rows and columns used to spatially represent the surface of the interconnect structure. In some embodiments, a congestion ratio is estimated for each grid by dividing the number of interconnects required in the grid by logical devices in a layout of the IC chip with the number of interconnects available for use in the interconnect structure defined by the grid. In some embodiments of the present invention, a congestion ratio is estimated for each grid for each direction in which the interconnects are designed to be routed through the grid; in some embodiments, the interconnects of a layer run along an x-axis and a y-axis (orthogonally) through each grid.

In some embodiments of the present invention, an estimate of the capacitance effects within a grid is derived from the congestion ratios estimated for the grid. In some embodiments, the capacitance effects are estimated using a predetermined table that enables a measure of the capacitance effect for a particular interconnect to be looked up as a function of, among other things, the probability of the particular interconnect having neighboring interconnects, i.e., other interconnects occupying routing tracks adjacent, above and below the particular interconnect. In some embodiments, an estimate of the probable existence of neighboring interconnects is derived for each grid from the congestion ratio estimates for the grid.

In some embodiments, the total capacitance effect exerted on an interconnect to be routed through multiple grids is estimated by determining the capacitance effects exerted within each grid through which the interconnect is to be routed, and then summing the resulting capacitance effects for each grid. In some embodiments, the capacitance effects exerted on an interconnect in a grid are estimated as a function of the length and the direction of the portion of the interconnect to be routed within the grid. The estimated total capacitance effects exerted on the interconnects to be routed in a particular IC design are then used, in some embodiments, to optimize the placement of the devices— and the interconnects connecting the devices—in the IC design for purposes of eliminating timing mistakes in the routed IC chip caused by excessive capacitance effects generated within the interconnect structure of the IC chip.

Figure 3:
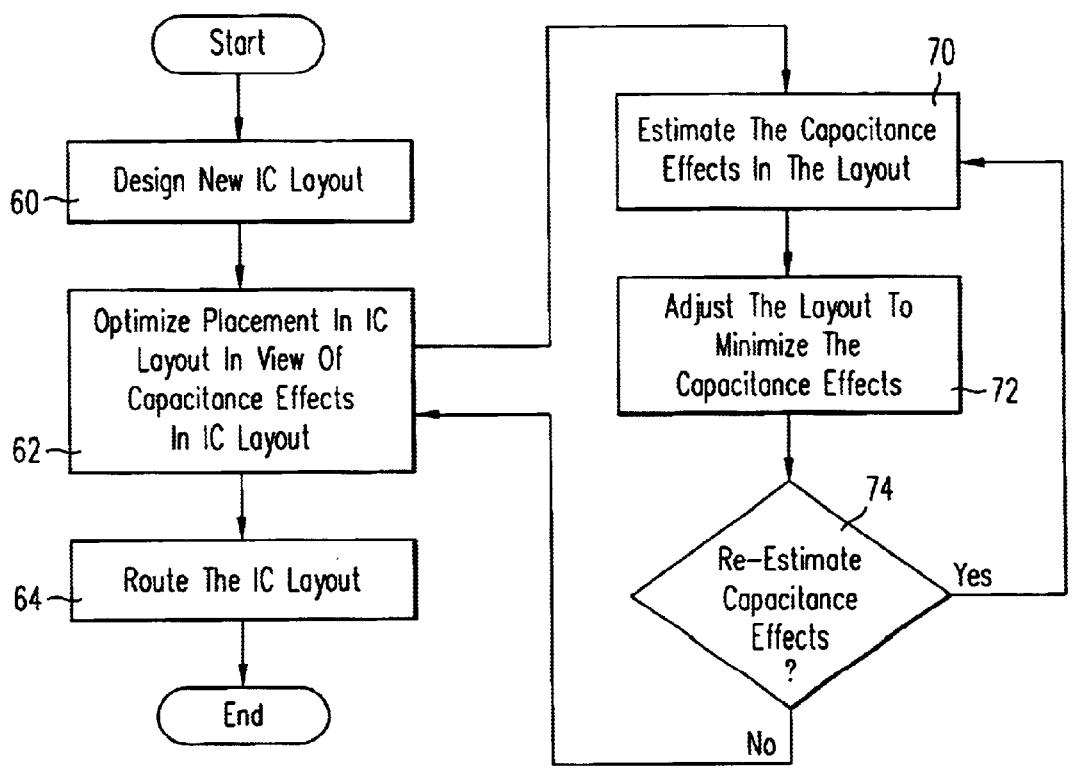
FIG. 3 is a high-level flow diagram illustrating the general IC design production context in which the present invention may be used, according to some embodiments of the present invention.

FIG. 3 is a high-level flow diagram illustrating a process for designing an integrated circuit, according to some embodiments of the present invention. In stage 60, a new IC layout is designed by placement of semiconductor devices (also called logic devices). Next, in stage 62, the placement of devices is optimized in the layout based on estimation of capacitance effects, which in turn is based on congestion estimates. In stage 64, the semiconductor devices are interconnected by a router using interconnects to be formed in a metal layer structure during automated design of the IC chip.

Stages 70 through 74 (FIG. 3) illustrate in more detail stage 62 for some embodiments of the present invention. In stage 70, capacitance effects in the IC layout are estimated based on the placement of the logic devices in the layout, and prior to routing of the interconnects between the logic devices. In stage 72, the placement of logic devices may be physically adjusted (from their locations determined in stage 60) to avoid excessive concentrations of capacitance effects in the metal layer structure; such an adjustment may affect placement of 1–2% of the devices in the IC. In stage 74, a new estimation of capacitance effects based on the newly adjusted device placement may be performed for purposes of accurately estimating capacitance effects in the newly adjusted device placement. The need to update the capacitance estimations for a particular device placement arises because the capacitance estimations are derived from the device placement; accordingly, after adjustment to the placement of the devices in response to a given capacitance estimation, the given estimated capacitances no longer provide an accurate estimation of capacitance for the adjusted device placement (because the capacitance estimations prior to update were derived from the original device placement by stage 60). The estimated capacitance effects are thus re-derived from the adjusted device placement to accurately reflect capacitance in the adjusted device placement.

Re-estimating new capacitance effects for the adjusted device placement is particularly recommended if substantial adjustments to the original device placement are performed in stage 72. Different criteria may be used to trigger a re-estimation of capacitance effects (a re-computation of the capacitance map) based on adjustments to the device placement. In some embodiments, for example, a re-estimation of capacitance may be triggered by a pre-determined number of discrete adjustments to the device placement, e.g., between 1000–2000 changes to the device placement (a change to the device placement includes, e.g., the addition of a new net, the removal of or modification to a pre-existing net).

In other embodiments, a re-estimation may be triggered if a pre-determined percentage of the nets in the net-list of the IC design are adjusted during optimization. In some of these latter embodiments, if more than e.g. 5% of the nets in the net-list are adjusted during optimization, then re-estimation of capacitance in the adjusted device placement may be automatically triggered; if less than e.g. 2% of the nets are adjusted, then re-estimation may not be triggered. In yet other embodiments, re-estimation of capacitance may be triggered by the occurrence of other processes, such as updation of a congestion map used in the IC design process for estimating interconnect congestion in the device placement; in these embodiments, updation of a congestion map may automatically trigger re-estimation of capacitance in the IC design.

Stage 70–74 may be repeatedly performed to ensure an accurate measurement of capacitance effects for a particular device placement throughout the course of design optimization. In some embodiments, the IC designer establishes a particular timing constraint to be reached during optimization. The need to re-compute estimations of capacitance in response to adjustments to device placement for accurately designing, or the use of a pre-determined timing constraint, are generally decisions dependent upon the design goals of the particular IC designer. In some embodiments, however, a placement is adequately optimized without iteration of stages 70–74.

Figure 4:
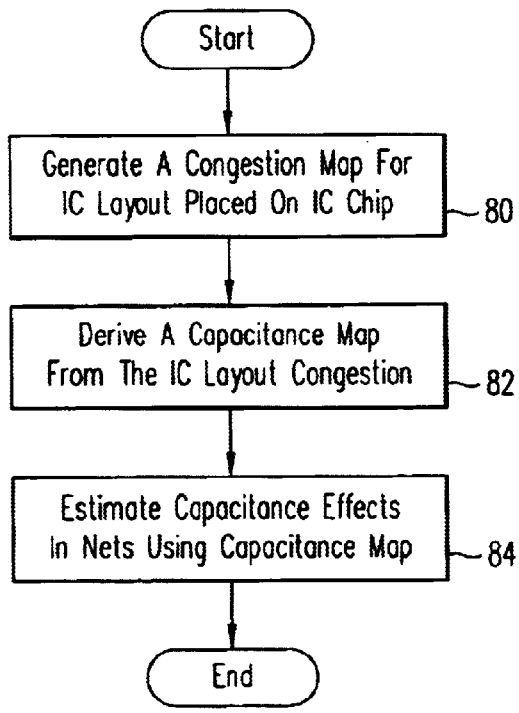
FIG. 4 is a high-level flow diagram illustrating a method of performing stage 70 in FIG. 3, according to prior art.

FIG. 4 is a high-level flow diagram illustrating a method for performing stage 70 in FIG. 3, according to some embodiments of the present invention. In stage 80, a particular IC layout is processed to produce a congestion map for the whole layout from individual congestion estimates of each of a number of portions of the layout. In stage 82, the congestion map is used to derive a capacitance map for estimating the local capacitance effects within the metal layer structure. Stage 80 may be skipped, and a capacitance map may be directly created from individual congestion estimates for each portion of the layout, without first generating a congestion map.

Figure 5:
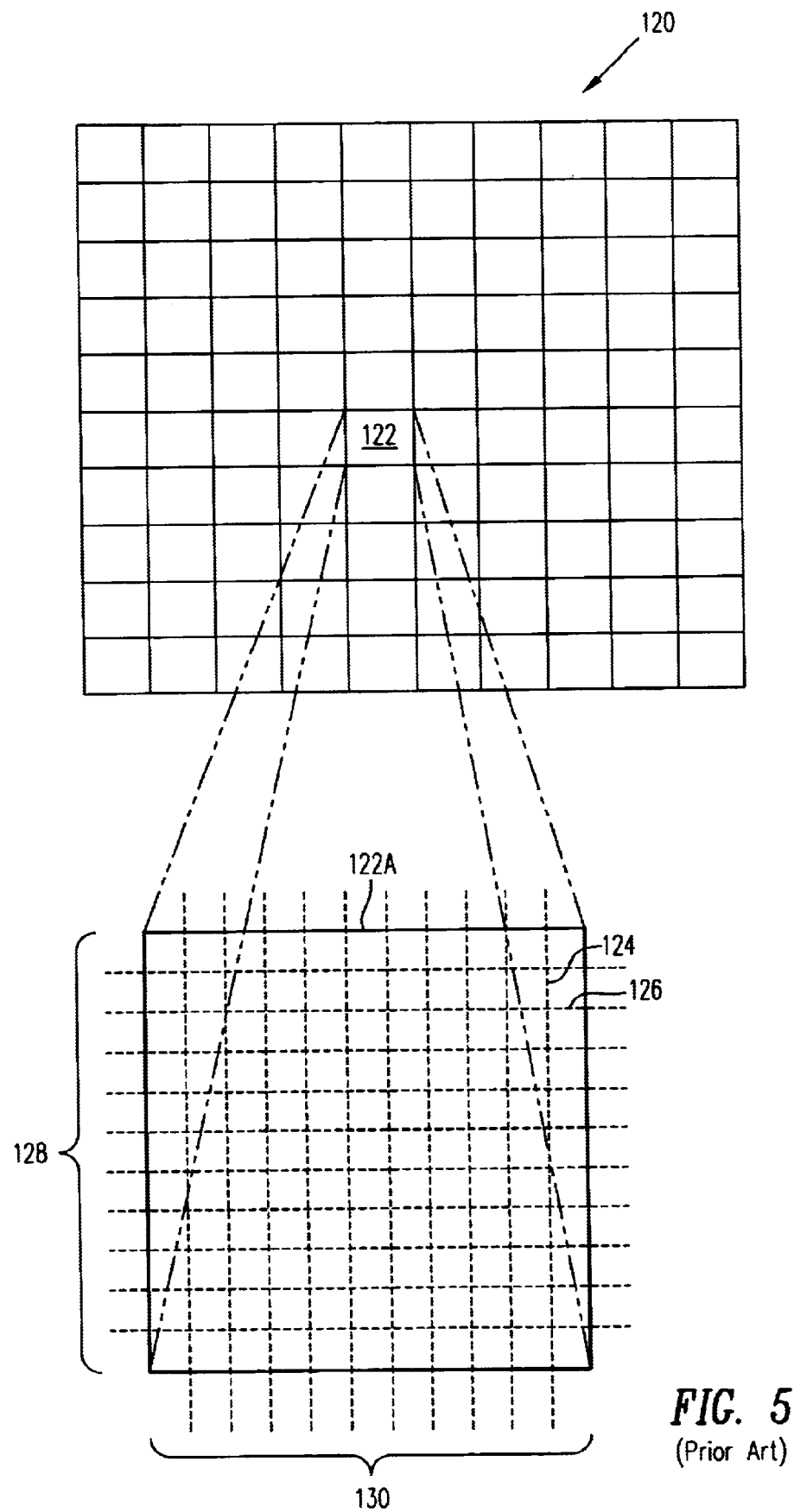
FIG. 5 is a block diagram illustrating a grid-matrix used to measure routing resources using the grid-matrix of FIG. 5, according to some embodiments of the present invention.

In such embodiments, for example, congestion may be estimated only locally for a grid for purposes of deriving an estimate of capacitance locally within the grid, but is otherwise discarded without creating a congestion map for the entire layout. In stage 84, the capacitance map is used to estimate the capacitance effects in the nets comprising the IC layout. Congestion may be estimated using a grid-matrix 120 (FIG. 5) to measure routing resources, according to some embodiments of the present invention. In particular, a close-up view 122A of an exemplary grid 122 within grid-matrix 120 is illustrated. Grid-matrix 120 comprises a two-dimensional abstraction of interlocking grids placed on—and coextensive with—the top surface of a metal layer structure in an IC layout; the grids (or "areas") are defined by a network of parallel horizontal and vertical lines forming a checker-board pattern of non-overlapping squares. In some embodiments, each grid, e.g., grid 122, is therefore used to represent the routing resource usage in a corresponding cross-section of the typically multi-layered metal layer structure. (Please note that a typical grid matrix 120 may have less or more grids than the number illustrated in FIG. 5).

The close-up view 122A of exemplary grid 122 illustrates a number of vertical and horizontal routing tracks, e.g., 124 and 126 respectively, available to a router for routing interconnects through the metal layer structure defined by grid 122 (the tracks are shown as dotted lines). During congestion estimation, the particular metal layer in which the tracks, e.g., 124 and 126, may be routed in the grid 122 is ignored. Therefore, as illustrated, ten routing resources (tracks) are available to the router in both the horizontal direction 128 and the vertical direction 130; more or less routing tracks may be available in the other grids in the grid-matrix 120. The number of routing tracks available in a particular grid may vary depending upon, for example, the grid size, the number of routing layers in the metal layer structure, the interconnect density in the routing layers, and the number of routing resources blocked by large semiconductor devices, such as a CPU.

Figure 6:
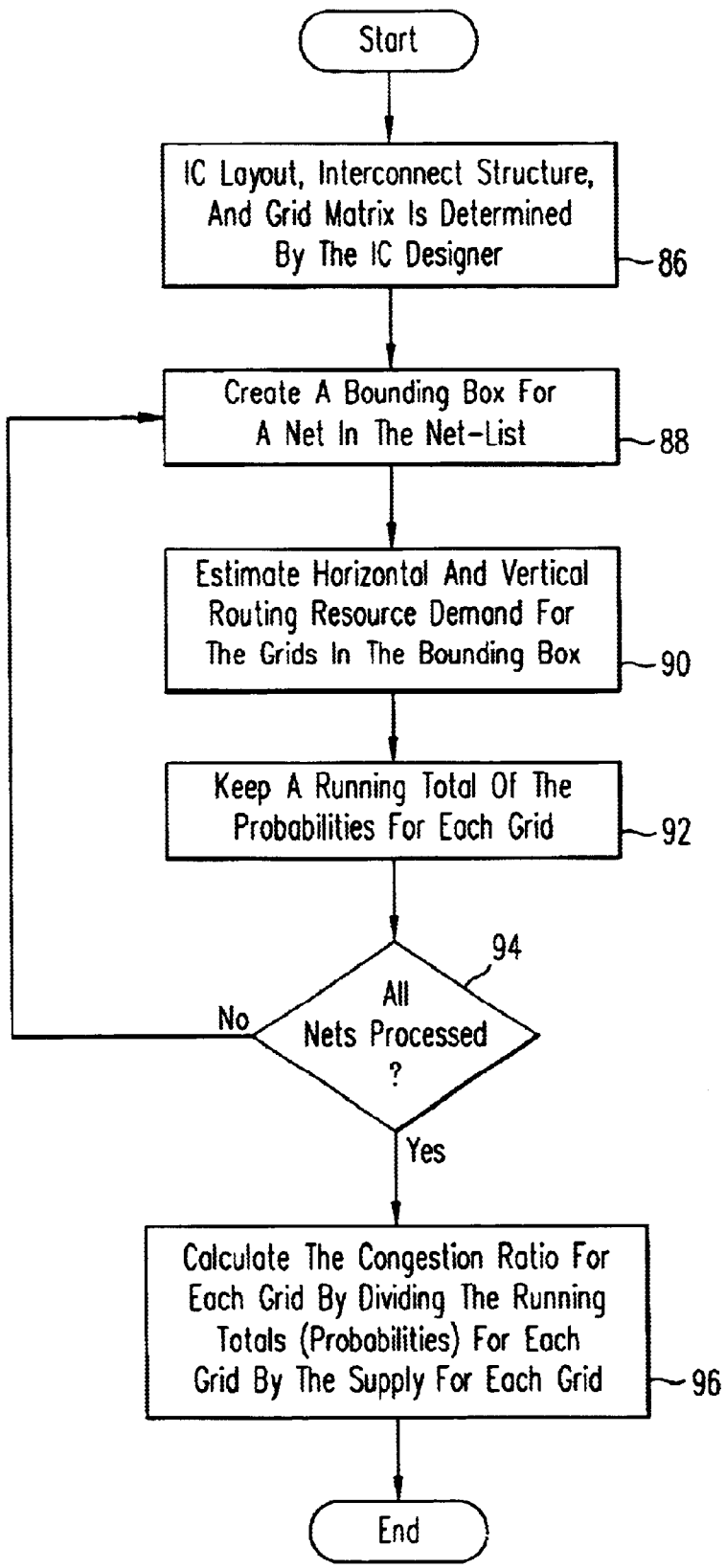
FIG. 6 is a flow diagram illustrating a method of performing stage 80 in FIG. 4, according to some embodiments of the present invention.
Figure 7:
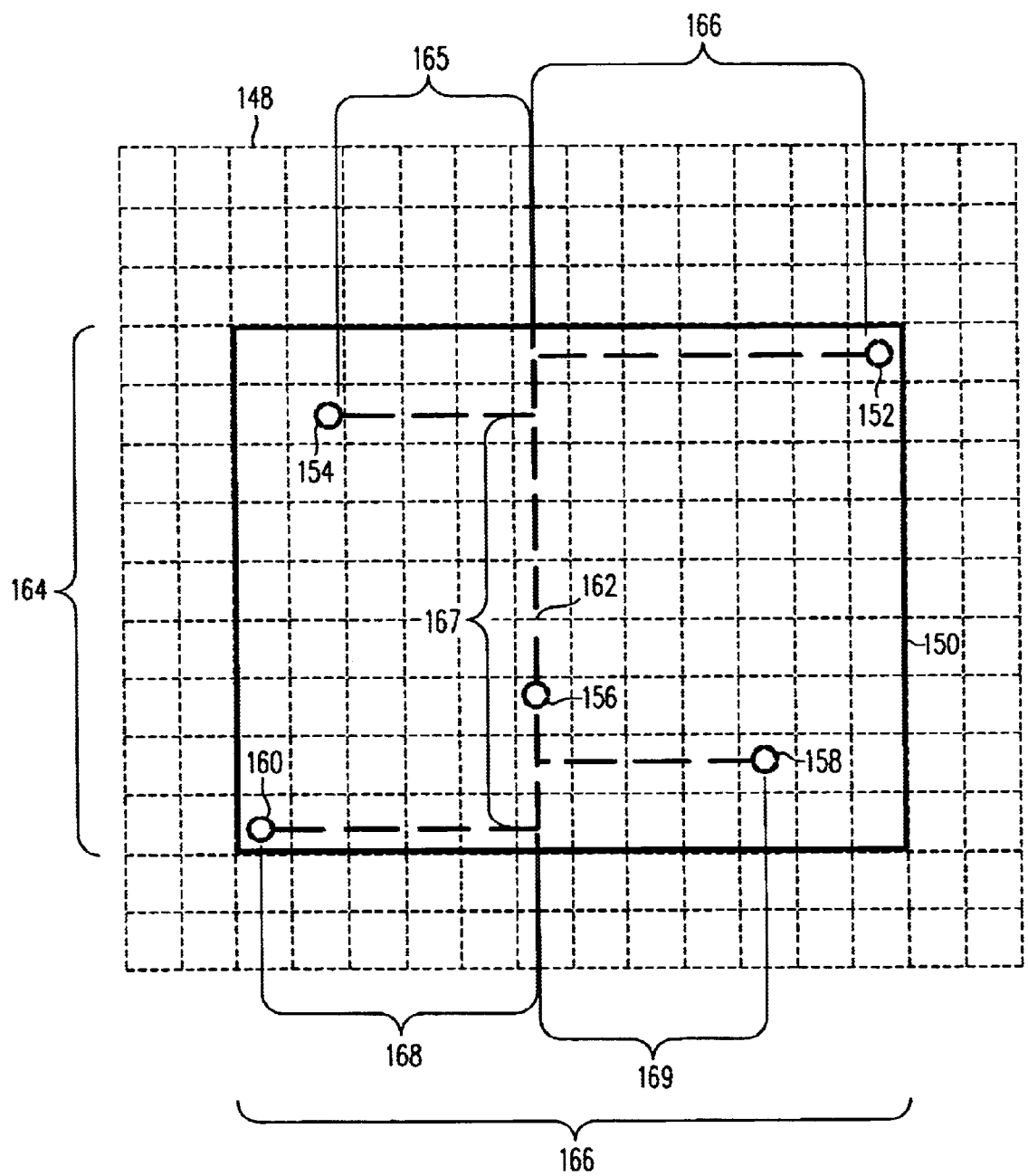
FIG. 7 is a block diagram illustrating a net in an exemplary grid-matrix 148 consisting of connective pins 152, 154, 156, 158 and 160 interconnected to one another and circumscribed by a bounding box 150, created by act 88 illustrated in FIG. 6.

FIG. 6 is a flow diagram illustrating a method for performing stage 80 in FIG. 4, according to some embodiments of the present invention. In stage 86, an IC layout (including the net-list for the layout), metal layer structure (e.g., the number and ordering of metal layers) and grid matrix (e.g., the dimensions of the grids) are previously determined by the IC designer. In stage 88, a bounding box is created for a net in the net-list. A "bounding box" herein refers to the minimum box formed using grids that encompasses all of the connective pins of the net, as illustrated in FIG. 7. Connective pins are the pins belonging to the semiconductor devices to be interconnected as defined by the particular net. In stage 90, for each grid in the bounding box, the number of interconnects required by the layout to be routed through each grid—an estimation of routing resource demand—is estimated in both the horizontal and vertical routing track directions. In some embodiments of the present invention, stages 88 and 90 are performed by calculating a minimum spanning tree or, in yet other embodiments, a rectilinear Steiner tree—both well-known calculations to those skilled in the art—for each net in the net-list. In stage 92, the resulting estimated number of vertical and horizontal routing tracks needed for each net per grid are stored in a running total for each respective grid.

For embodiments that use a minimum spanning tree or a rectilinear Steiner tree to estimate interconnect demand, stage 92 is performed by keeping a running total of interconnects to be formed in each grid in each direction by each minimum spanning tree or rectilinear Steiner tree calculated in stages 88–90. In stage 94, all of the nets in the net-list are processed through stages 88 through 92, thereby resulting in running totals for each grid representing the total number of routing tracks in the vertical and horizontal directions demanded by the particular net-list. In stage 96, congestion ratios for each grid are determined by dividing the running totals for routing resource demand calculated in stages 90 through 94—i.e., routing resource demand for each grid—by the routing resource supply for each grid. The resulting congestion ratios (total routing resource demand divided by total routing resource supply for each grid) forms a congestion map. In some embodiments the congestion map provides a mapping of relative congestion in the horizontal and vertical directions on a grid by grid basis over the metal layer structure. In certain embodiments, the congestion map may be displayed as a colored image to the IC designer, wherein the higher congestion ratios are shown with colors different from lower congestion ratios, to provide ready detection by a human of high-congestion areas in an IC design, for purposes of optimization.

Figure 8:
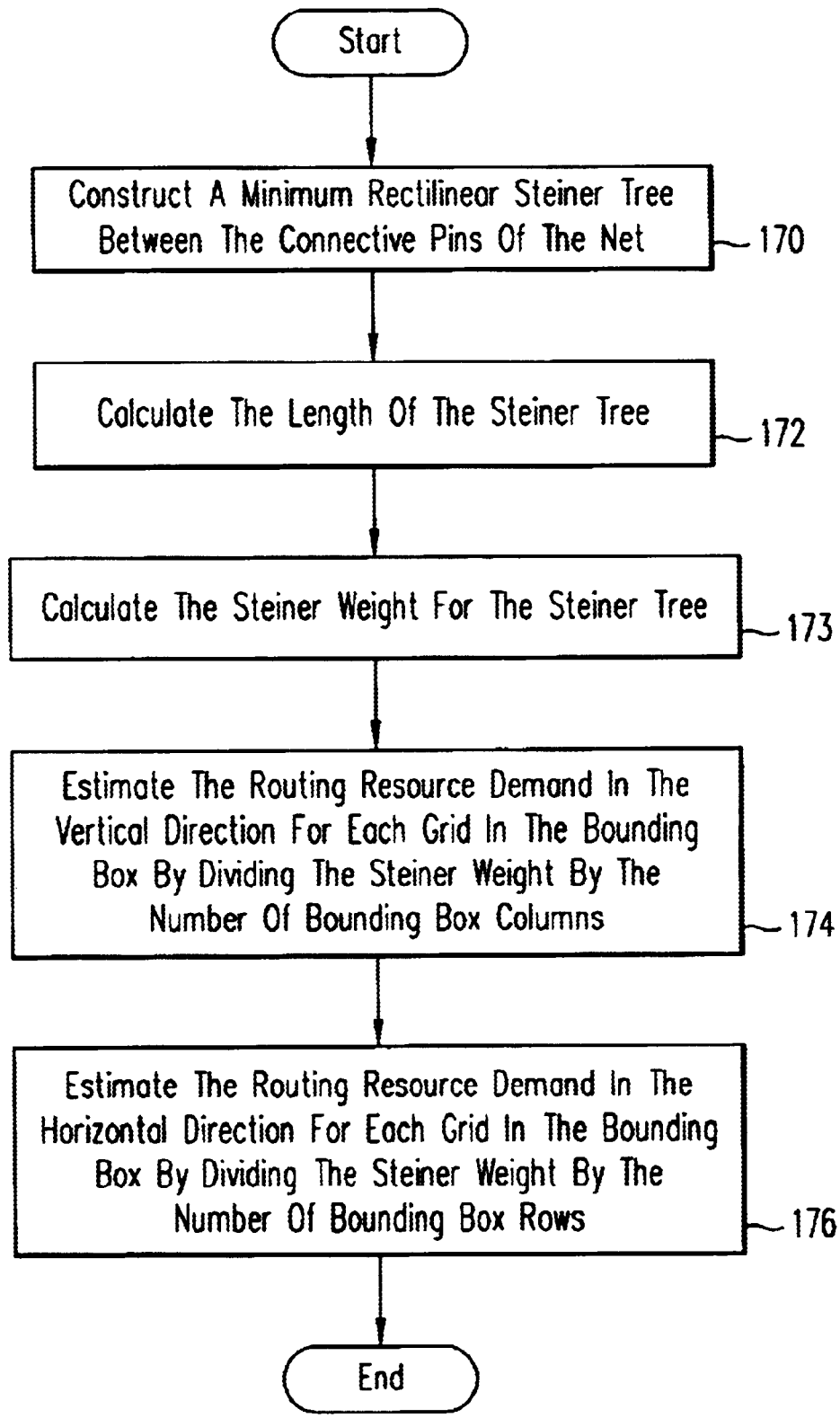
FIG. 8 is a flow diagram illustrating how the components in FIG. 7 are used to estimate routing resource demand in stage 90 of FIG. 6 using Steiner weights, according to some embodiments of the present invention.

Routing resource demand for an exemplary net consisting of connective pins 152, 154, 156, 158 and 160 (FIG. 7) placed in an exemplary grid-matrix 148 may be computed using any spanning tree method well known in the art. A bounding box 150 defined by the aforementioned connective pins includes a number of columns 166, and a number of rows 164. The columns 166 and the rows 165 equal the length of the net 162 in grids in the horizontal and vertical directions respectively. FIG. 8 is a flow diagram illustrating how the components in FIG. 7 are used to estimate routing resource demand in stage 90 of FIG. 6 using Steiner weights, according to some embodiments of the present invention. A Steiner weight is generally a measure of the ratio between the length of a net and its size, and may be used advantageously to estimate routing congestion in a metal layer structure as described in FIG. 8.

Turning to FIG. 8, in stage 170, a minimum rectilinear Steiner tree 162 is constructed between the connective pins, e.g., 152, 154, 156, 158 and 160, of a given net. A minimum rectilinear Steiner tree 162 as used herein refers to a minimum spanning tree of rectilinear shape connecting all of the connective pins of a net. Depending on the implementation, the minimum rectilinear Steiner tree may be estimated (and not actually determined) because of excessive inefficiencies and complexities associated with algorithms for determining the exact minimum rectilinear Steiner tree for a given net (note that there may be more than one solution for a given net). In stage 172, the length of an estimated minimum rectilinear Steiner tree is calculated in terms of grid lengths. Estimation of length in stage 172 is illustrated in reference to FIG. 7, where the length of minimum rectilinear Steiner tree 162 equals the length of the line segments 165, 166, 167, 168 and 169. The lines segments 165–69 equal, approximately, the sum of 3.5 (segment 165), 6 (segment 166), 8 (segment 167), 5 (segment 168), and 4 (segment 169), equaling a total of 26.5 grid lengths.

In stage 173, the Steiner weight for the Steiner tree is estimated. The Steiner weight in the vertical direction for all of the grids in the bounding box 150 is estimated in some embodiments by dividing the minimum rectilinear Steiner tree length calculated in stage 172 by the number of columns 166 plus the number of rows 164 comprising the bounding box 150. In FIG. 7, the number of columns 166 in the bounding box 150 equals 12, and the number of rows equals 9; therefore, in this example, the Steiner weight for each grid within bounding box 150 equals 26.5 divided by 21, or 1.206. The Steiner weight of 1.206 also provides a measure of resource congestion, hereafter "congestion ratio." In particular, a congestion ratio of 1.206 means that for purposes of estimation, over 20% as many routing tracks in the vertical direction are required than are available within the grids defined by bounding box 150. In stage 176—in like manner as stage 174—the routing resource demand in the horizontal direction for all of the grids in the bounding box 150 is estimated by dividing the Steiner weight by the number of rows 164 in the bounding box 150; for the exemplary net in FIG. 7, this equals 1.206 divided by 9, or 0.134. It should be noted that for purposes of congestion estimation, the ratio of the lengths of the minimum rectilinear Steiner tree to the lengths of the bounding box edges provides the relevant Steiner weight for stages 174 and 176; consequently, other units of measurement instead of grid lengths may be used so long as a consistent measure of ratio is preserved.

An alternative to calculating Steiner weights for stage 173 is illustrated in Table 1. In this embodiment, the estimated Steiner weight is computed merely as a linear function of the connective pin count "p" of the net. The first order and zero order coefficients of the linear function are derived experimentally before use in the pre-routing optimization stage, from a large sample of Steiner weights computed from randomly generated nets in accordance with stages 170 through 176 of FIG. 8. The estimated linear functions for computing Steiner weights is provided in Table 1, according to some embodiments of the present invention.

TABLE 1

| # of Connective Pins (p) | Estimated Steiner Weight |
|---|---|
| $p \leq 3$ | 1 |
| $3 < p \leq 10$ | $p * 0.068 + 1$ |
| $10 < p \leq 20$ | $p * 0.045 + 1$ |
| $20 < p \leq 30$ | $p * 0.035 + 1$ |
| $30 < p \leq 40$ | $p * 0.033 + 1$ |
| $50 < p \leq 50$ | $p * 0.030 + 1$ |
| $p > 50$ | 3 |

As shown in Table 1, the coefficients of the linear function change for each multiple of ten connective pins; the two exceptions to this are for small nets with 0 to 3 connective pins, and large nets with greater than 50 pins. In the former case of 0 to 3 connective pins, the Steiner weight is 1, and in the latter case of more than 50 connective pins, the Steiner weight is capped at 3. For nets having connective pins between 3 and 50, the Steiner weight varies between 1 and 3.

Figure 9:
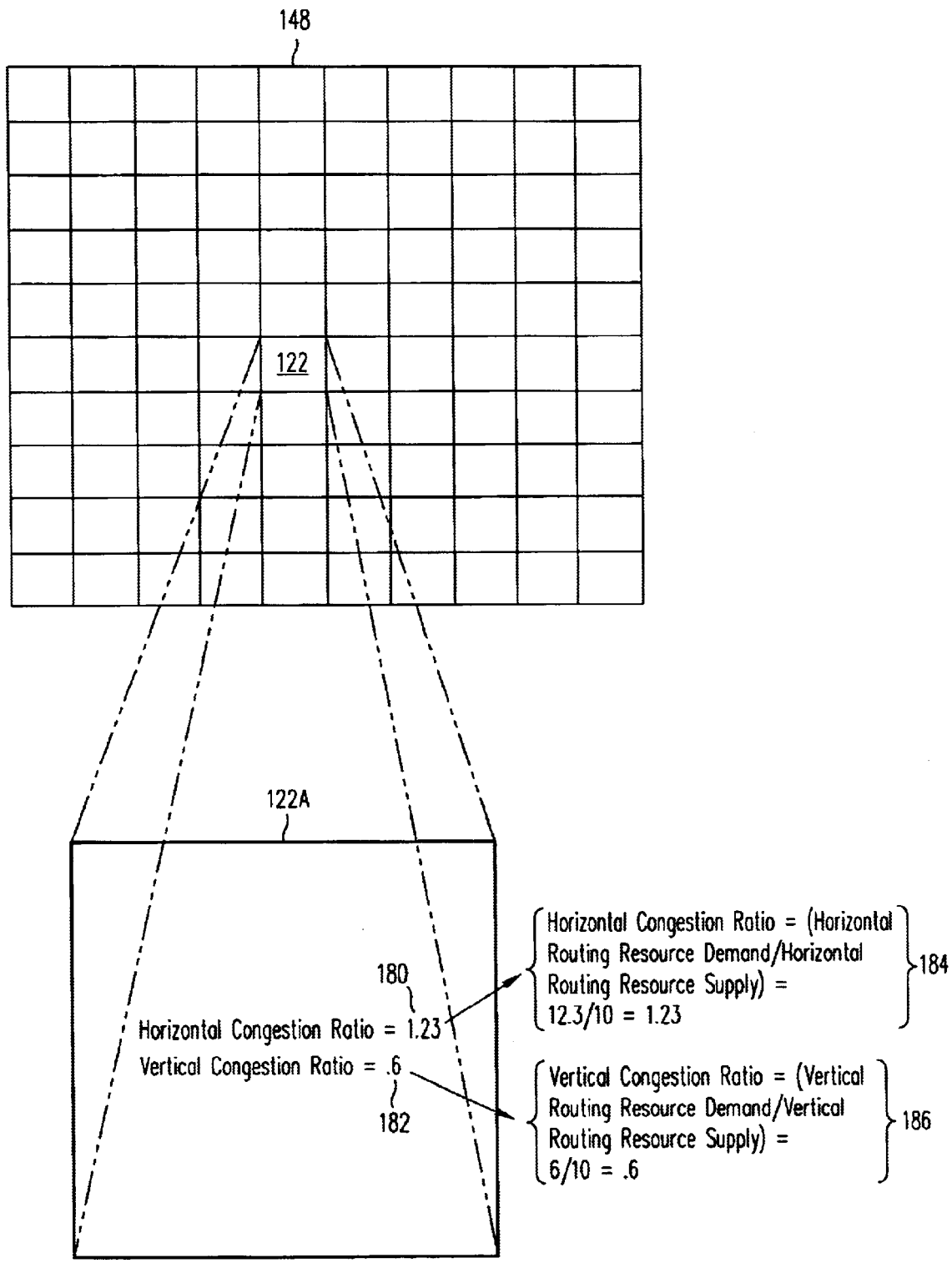
FIG. 9 is a block diagram illustrating a congestion map derived in accordance with the flow diagram in FIG. 6, according to some embodiments of the present invention.

FIG. 9 is a block diagram illustrating a resulting congestion map that is generated in accordance with the flow diagram in FIG. 6. In FIG. 9, a close-up view 122A of exemplary grid 122 in grid-matrix portion 148 is illustrated. In stages 88 through 92 of FIG. 6, a running total of horizontal and vertical routing resource demands for each net in the net-list is associated with each grid in the matrix-grid for the layout. In stage 96, the resulting running totals represent an estimate of the number of interconnects needed by the layout on a grid-wide basis across the metal layer structure.

Thus, for example, in the example of FIG. 9, the exemplary running total 180 for horizontal routing demand for grid 122 may be assumed to be 12.3 for illustrative purposes (shown in computation 184); this means that an estimated 12.3 tracks are needed by the layout in grid 122 for the horizontal direction. In like manner, the vertical routing demand for grid 122 for the layout may be assumed for illustrative purposes to be 6 (illustrated in computation 186). In addition, the total supply of tracks for grid 122 may be assumed to be 10 in both directions (illustrated in computations 184 and 186). Given these assumptions, the congestion ratios for grid 122 are therefore the total routing demand divided by the total routing supply in the horizontal and vertical directions; in this example, the horizontal congestion ratio 180 is 1.23, and the vertical congestion ratio 182 is 0.6. The horizontal congestion ratio indicates that more routing tracks are needed than supplied for this layout in grid 122, and the vertical congestion ratio indicates that an adequate number of routing tracks are available to implement the layout in the grid 122. The horizontal and vertical congestion ratios are accordingly calculated for each grid, thereby providing a two-dimensional per-grid measure of resource congestion—a congestion map—for a particular layout and metal layer structure.

A capacitance map, as used herein, is analogous to a congestion map but provides a measure of capacitance effects—instead of congestion—as distributed across a metal layer structure, typically on a grid by grid basis. In some embodiments of the present invention, the capacitance map is derived from the congestion map. In other embodiments, a capacitance map may be created without first creating a map of congestion across the entire chip; in these embodiments, for example, capacitance estimates may be derived from individual congestion estimates on a grid by grid basis, wherein the congestion estimates are not stored together to form a map. In yet other embodiments, capacitance may be estimated only in one or more localized areas of the metal layer structure, for example, in one or more grids where substantial congestion (and therefore capacitance) is predicted to occur. Those skilled in the art will recognize that the principles and teachings of the present invention may be embodied in these and similar embodiments.

In addition, some embodiments according to with the present invention may estimate capacitance using previously developed tools for estimating actual routing congestion that will be present at the routing stage. In particular, capacitance is often calculated at the routing stage using a conventional Table Look-Up Model in which capacitance values are retrieved for a given interconnect by performing a look-up call to a table of pre-computed capacitance values. The capacitance values in the table are pre-computed on the basis of a predetermined set of parameters associated with the geometry of the interconnects; the parameters may include the number of metal layers in the metal layer structure, the number and location of neighboring interconnects, and the spacing, width and pitch (width plus spacing) of the interconnects. (A "neighboring interconnect" and a "coupling vector" are described in more detail below.) Because the spacing, width and metal layers used in the metal layer structure are typically a matter of design choice known during the pre-routing stage, the Table Look-Up Model may be advantageously used during the pre-routing optimization stage if coupling vectors for an interconnect are estimated.

In some embodiments of the present invention, a method and system for estimating coupling vectors from congestion ratios are provided. As used herein, a "coupling vector" generally provides a measure of the probable existence of interconnects neighboring ("neighboring interconnects") a hypothetical interconnect located in a portion of the design, e.g., interconnect 200; it should be noted that "coupling vector" is also used herein to describe the actual existence of neighboring interconnects in the post-routing metal layer structure shown in FIG. 10 (this usage of the term, however, is for illustrative purposes). A coupling vector for purposes of using the Table Look-Up Model is described in reference to FIG. 10 below.

Figure 10:
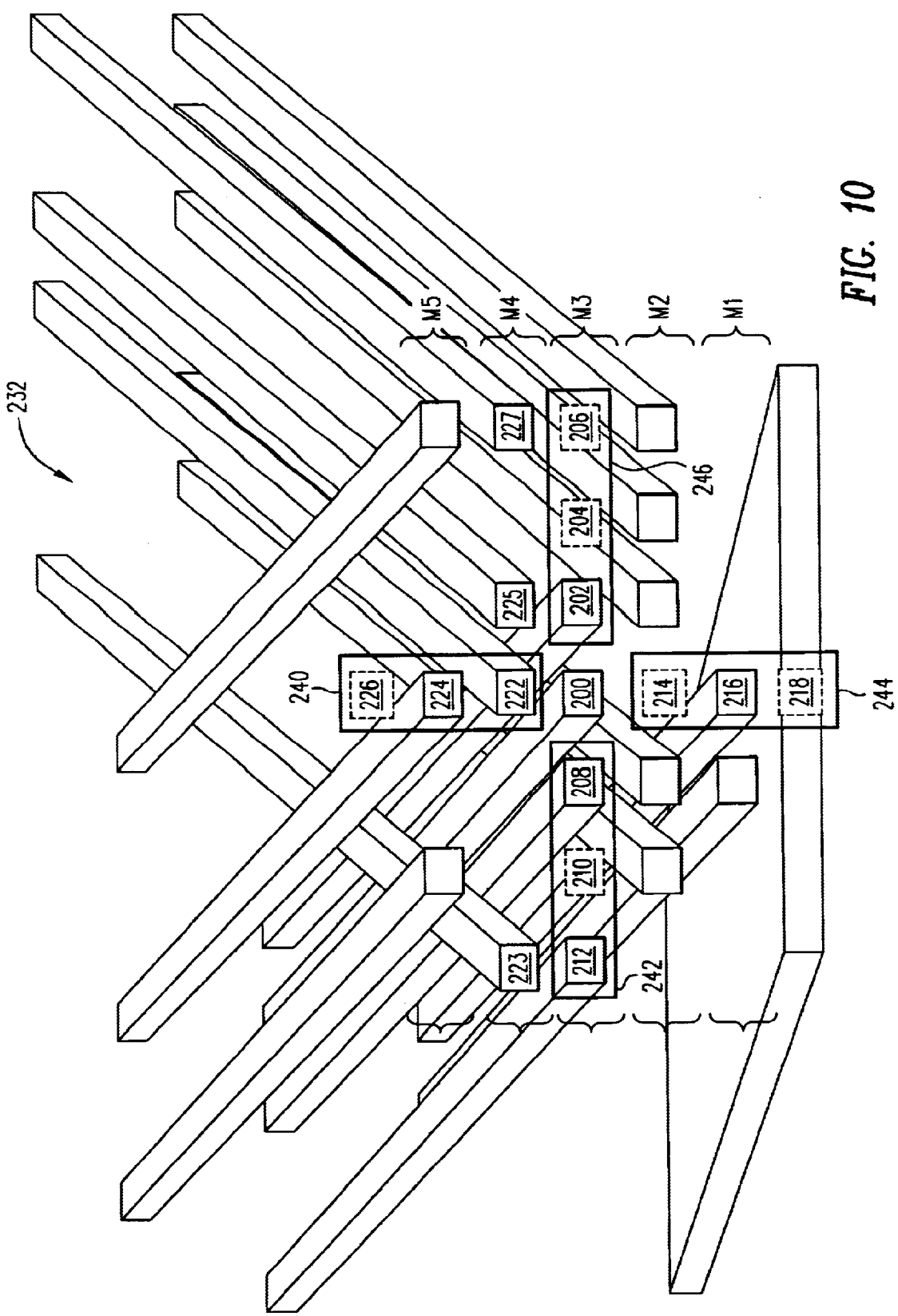
FIG. 10 is a block diagram illustrating a coupling vector relative to a reference interconnect 200 in the post-routing metal layer structure of FIG. 2, according to some embodiments of the present invention.

FIG. 10 is a block diagram illustrating four coupling vectors 240, 242, 244 and 246 relative to interconnect 200 in the post-routing metal layer structure of FIG. 1, according to some embodiments of the present invention. (It should be noted that the direction in which interconnect traverse in adjacent metal layers e.g. metal layers M5 and M4 in FIG. 10 is orthogonal—in accordance with FIG. 1—even though FIG. 10 illustrates a different angle (smaller) e.g. between interconnects 222 and 224, for purposes of simplicity of drawing.) The neighboring interconnects may be measured in two directions for capacitance effects—parallel and orthogonal—relative to interconnect 200. Interconnects lying in the same metal layer as interconnect 200 are typically parallel to interconnect 200; interconnects lying in other layers are typically parallel to or orthogonal with interconnect 200. For example, in FIG. 10, interconnects 212, 208 and 202 are parallel interconnects lying in the same metal layer M3 as the reference interconnect 200; interconnect 222 is an orthogonal interconnect lying in the metal layer M4 above the reference interconnect 200; interconnect 224 is a parallel interconnect lying in the metal layer M5 above interconnect 200; and interconnect 216 is a parallel interconnect lying in the metal layer M1 below interconnect 200. It should be noted that in the pre-routing optimization context, interconnect 200 typically refers to an interconnect segment defined by the length of a grid (not illustrated in FIG. 10).

Typically the neighboring interconnects included in a coupling vector being estimated in the pre-routing design context are assumed to be located up to a predetermined number (N) of spacings away from the reference interconnect (resulting in an N-dimensional coupling vector); in some embodiments, the value of N may be 3. Generally, greater accuracy in estimating coupling effects may be achieved using coupling vectors with larger N values; the increased accuracy, however, is gained at the expense of computational overhead. An N value of 3 is used in one embodiment, for providing an acceptable trade-off between accuracy and performance for ordinary estimation purposes under current technologies. FIG. 10 illustrates exemplary coupling vectors 240, 242, 244, and 246 in reference to an exemplary interconnect 200.

Exemplary (N=3) coupling vectors 240, 242, 244 and 246 are illustrated in reference to FIG. 10, according to some embodiments of the present invention. Three kinds of coupling vectors—an adjacency coupling vector, e.g., 242 or 246, an upper-layer coupling vector, e.g., 240, and a lower-layer coupling vector, e.g., 244, are computed for purposes of estimating the existence of neighboring interconnects. In particular, adjacency coupling vectors 242 and 246 estimate the likely existence (in the pre-routing context) or the actual existence (in the post-routing context) of neighboring interconnects directly adjacent to an interconnect 200, in the same metal layer, e.g., M3, as interconnect 200. An upper-layer coupling vector 240 estimates the likely existence (in the pre-routing context) or the actual existence (in the post-routing context) of neighboring interconnects in the metal layers between interconnect 200 and the "sky layer" 226. (The "sky layer" is a term in the art describing the empty space above the interconnect structure 232 for purposes of capacitance estimation—it has a capacitance effect of zero.) And, lastly, a lower-layer coupling vector 244 estimates the likely existence (in the pre-routing context) or the actual existence (in the post-routing context) of neighboring interconnects in the metal layers between interconnect 200 and the ground plane 218 (in contrast to the sky layer 226, the ground plane 218 has a capacitance effect of one).

Adjacency coupling vector 242, for example, may be computed as (1, 0, 1), representing parallel interconnects 208 and 212 in tracks one and three spacings away from interconnect 200 respectively (this means, e.g., that the probability of interconnect 208 being located in the respective track is 1.0, or 100%). Upper-layer coupling vector 240 may likewise be represented as (1, 1, sky), representing interconnect 222 in metal layer M4, interconnect 224 in M5, and the sky layer 226. It should be noted that a sky layer and a ground plane layer are computed as additional coupling dimensions in upper-layer coupling vector 240 and lower-layer coupling vector 244 respectively. It should also be noted that the upper and lower-layer coupling vectors may not include a sky layer dimension or ground plane layer dimension if the sky layer or ground plane layer are beyond N spacings from a given interconnect. For example, in FIG. 10, if the coupling vectors are computed for an interconnect lying in metal layer M2, the vertical coupling vector above the reference interconnect only requires consideration of interconnects in M3, M4 and M5 (where N=3), because the sky layer exerts miniscule capacitance effect; likewise, the vertical coupling vector for layers below the M2 reference interconnect would only contain two dimensions, M1 and the ground plane.

Although the metal layer structure of FIG. 10 is shown already routed, the embodiments of the present invention are directed to pre-routing optimizations of the metal layer structure. Accordingly, the physical locations of the interconnects as illustrated in FIG. 10 are as yet unknown; this includes the location of neighboring interconnects within the metal layer relative to a given interconnect, and the neighboring interconnects distributed across the other metal layers. Consequently, at the pre-routing stage, the coupling vectors 240, 242, 244 and 246 require estimation, for purposes of using a Table Look-Up Method to determine capacitance.

Figure 11:
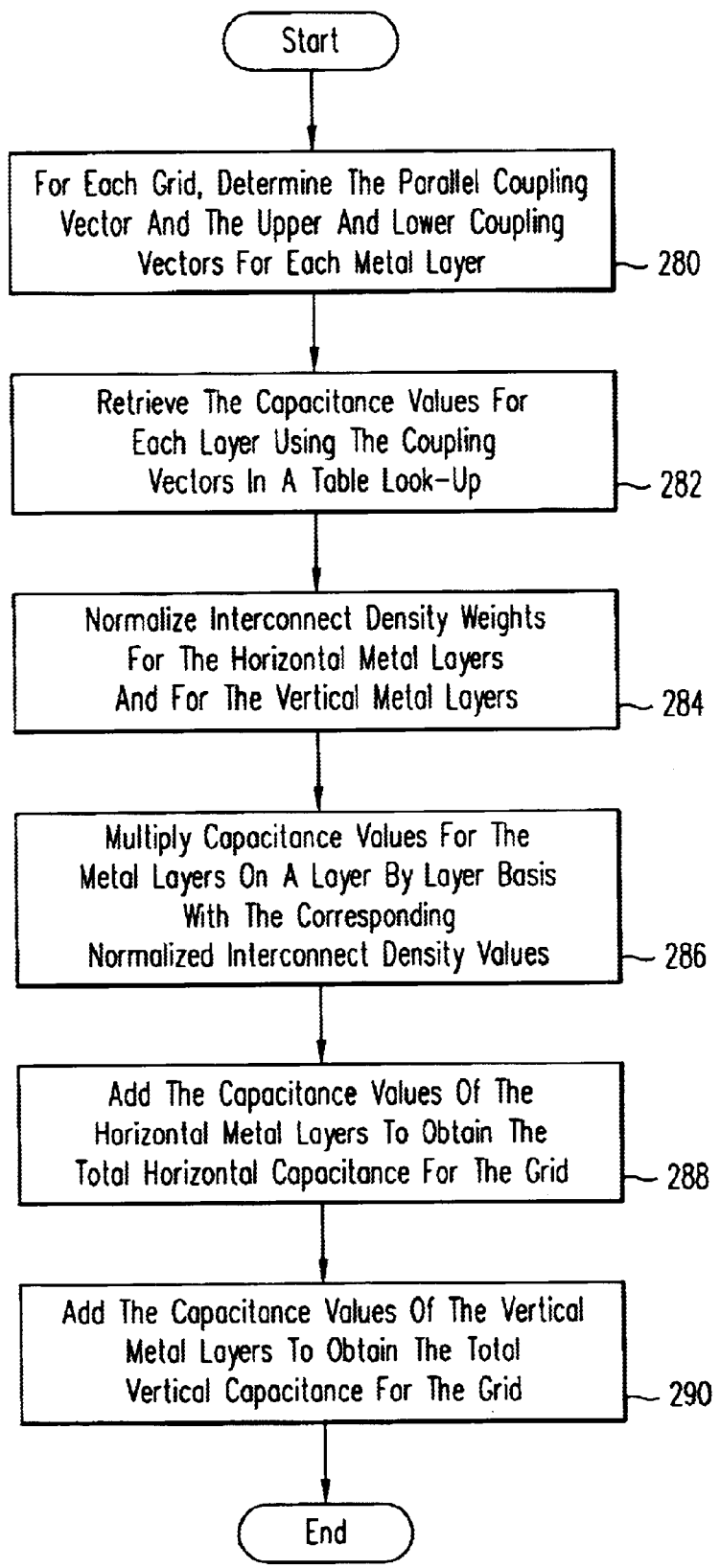
FIG. 11 is a flow diagram illustrating a method of estimating capacitance in the horizontal and vertical directions per grid of a grid-matrix, according to some embodiments of the present invention.

FIG. 11 is a flow diagram illustrating a method for estimating capacitance effects in the horizontal and vertical directions per grid of a grid-matrix, according to some embodiments of the present invention. The stages in FIG. 11 will be described in reference to FIG. 10 where appropriate. In stage 280, for each grid, the coupling vectors are estimated for each metal layer; the coupling vectors include adjacency coupling vectors 242 and 246, an upper-layer coupling vector 240, and a lower-layer coupling vector 244. The coupling vectors are derived from the congestion map as described below in reference to Tables 3 and 4, and FIG. 12, in accordance with some embodiments of the present invention.

In stage 282, the coupling vectors are used in a conventional Table Look-Up Method for estimating the capacitance effects for each grid. In the Table Look-Up Method, parameters pre-determined by the IC designer (and dependent, e.g., on the physical characteristics of the IC chip), including the coupling vectors, the interconnect range value N, the number of metal layers, and the width and spacing of the interconnects within the grid, are used to index a table of pre-computed capacitance values. The pre-computed capacitance effects in the Table represent estimations derived empirically by a particular IC manufacturer from similar IC designs for use in guiding the actual routing of the IC design. Such tables are well-known in the art of IC fabrication, and are typically generated by the semiconductor foundry of major IC manufacturers using substantial testing and calibrations based on the particular fabrication requirements of the IC manufacturer (e.g., the type of metal typically used in this interconnect structure, the number and ordering of metal layers in the interconnect structure, and the functional characteristics of the IC design).

In stage 284, the interconnect density weights for the horizontal and vertical metal layers are normalized to 1. Normalization is performed separately for the horizontal and vertical metal layers. For example, normalization of the horizontal metal layers is performed by first summing the interconnect density weights for a given horizontal metal layer, and then dividing the interconnect density weights of that horizontal metal layer by the summed result. Normalization of the vertical metal layers is similarly performed. The interconnect density weights represent estimations of the interconnect density as distributed across each metal layer in the interconnect structure of a particular layout design; the weights are empirically derived from analysis of the interconnect densities of generally similar layouts using similarly layered interconnect structures. The recommended interconnect density weights as a function of the number of metal layers in the interconnect structure for some embodiments compatible with the present invention are provided in Table 2:

TABLE 2

Interconnect Density Weights

| # Metal Layers | Metal Layer | Interconnect Density Weights |
|---|---|---|
| 2 | M1 | 0.5 |
|   | M2 | 0.5 |
| 3 | M1 | 0.05 |
|   | M2 | 1.0 |
|   | M3 | 0.95 |
| 4 | M1 | 0.05 |
|   | M2 | 0.30 |
|   | M3 | 0.95 |
|   | M4 | 0.70 |
| 5 | M1 | 0.02 |
|   | M2 | 0.35 |
|   | M3 | 0.63 |
|   | M4 | 0.65 |
|   | M5 | 0.35 |
| 6 | M1 | 0.02 |
|   | M2 | 0.30 |
|   | M3 | 0.63 |
|   | M4 | 0.45 |
|   | M5 | 0.35 |
|   | M6 | 0.25 |
| 7 or More | M1 | 0.04 |
|   | M2 | 0.85 |
|   | M3 | 1.0 |
|   | M4 | 1.0 |
|   | >M4 | 0.75 |

The interconnect density weights of Table 2—if normalized—thus represent an empirically-derived estimation of the percentage distribution of interconnects over the metal layers of the metal layer structure as a function of the number of metal layers in the interconnect structure. For example, in a typical structure having five metal layers, as shown in Table 2, the first metal layer is comparatively the least dense (M1=0.02) relative to the other metal layers (e.g., M2=0.35). One reason for the comparative difference in interconnect density weights between M1 and M2 is that in typical IC layouts employing a five metal layers, with the first metal layer being adjacent to the semiconductor substrate embedding the solid-state devices—is often substantially blocked by macrocells and other large devices protruding into the first metal layer from the semiconductor substrate. Accordingly, a large proportion of the first metal layer is made unusable by the router for routing interconnects.

In stage 284, normalizing the horizontal metal layers requires normalization of the interconnect density weights for M1 (0.02), M3 (0.63) and M5 (0.35), which, in this example, are already normalized (i.e., 0.02+0.63+0.35=1.0). If, however, the horizontal metal layers contain layers M1 and M3 only, then M1 (0.02) and M3 (0.63) are normalized to 0.03 (0.02/(0.02+0.63)) and 0.97 (0.63/(0.02+0.63)) respectively. In like manner, the vertical metal layers are identified and normalized using Table 2. In stage 286, the capacitance values for the metal layers retrieved in stage 282 are multiplied on a layer by layer basis with the corresponding normalized interconnect density values. In stage 288, the capacitance values for each horizontal metal layer resulting from stage 286 are added together to give a single grid's capacitance for interconnects running in the horizontal direction. In stage 290, the capacitance values for each vertical metal layer resulting from stage 286 are added together to give a single grid's capacitance for interconnects running in the vertical direction.

It should be noted that the grid-matrix used for capacitance estimation is typically dimensioned identically to the grid-matrix used for congestion estimation; however, the two grid-matrices may also be dimensioned differently, e.g. one of the grid-matrices may be a multiple of the other (e.g., the congestion grid-matrix has twice as many columns and rows as the capacitance grid-matrix). When dimensioned differently, a function is used to map congestion values from one grid map (e.g. congestion) to another grid matrix (e.g. capacitance). The mapping function may be e.g. linear, depending on the relation between the grid matrices. It should also be noted that the grid matrices used for purposes of congestion and capacitance estimation may include rows and/or columns of differing heights and lengths respectively, and an appropriate mapping function is used.

A method is used, e.g. with Tables 3 and 4 below, and described in reference to FIG. 12, for estimating the coupling vectors in stage 280 of FIG. 10, according to some embodiments of the present invention. In stage 280, estimates of the coupling vectors are calculated prior to routing; the coupling vectors being estimated at this stage are a function of the probability of existence of neighboring interconnects relative to a reference interconnect, because at this stage actual existence is unknown. Note that, referring back to FIG. 10, the actual (and not estimated) coupling vectors 240, 242, 244 and 246 are illustrated (to N=3 dimensions (i.e., N=3 spacings from the reference interconnect 200) in a post-routing metal layer structure, because in FIG. 10, the location of the neighboring interconnects, e.g., 222, 224, 212, 208, 202 and 216 is shown post routing for the purposes of illustration only, and no estimation is required when such interconnects are known to exist.

Figure 12:
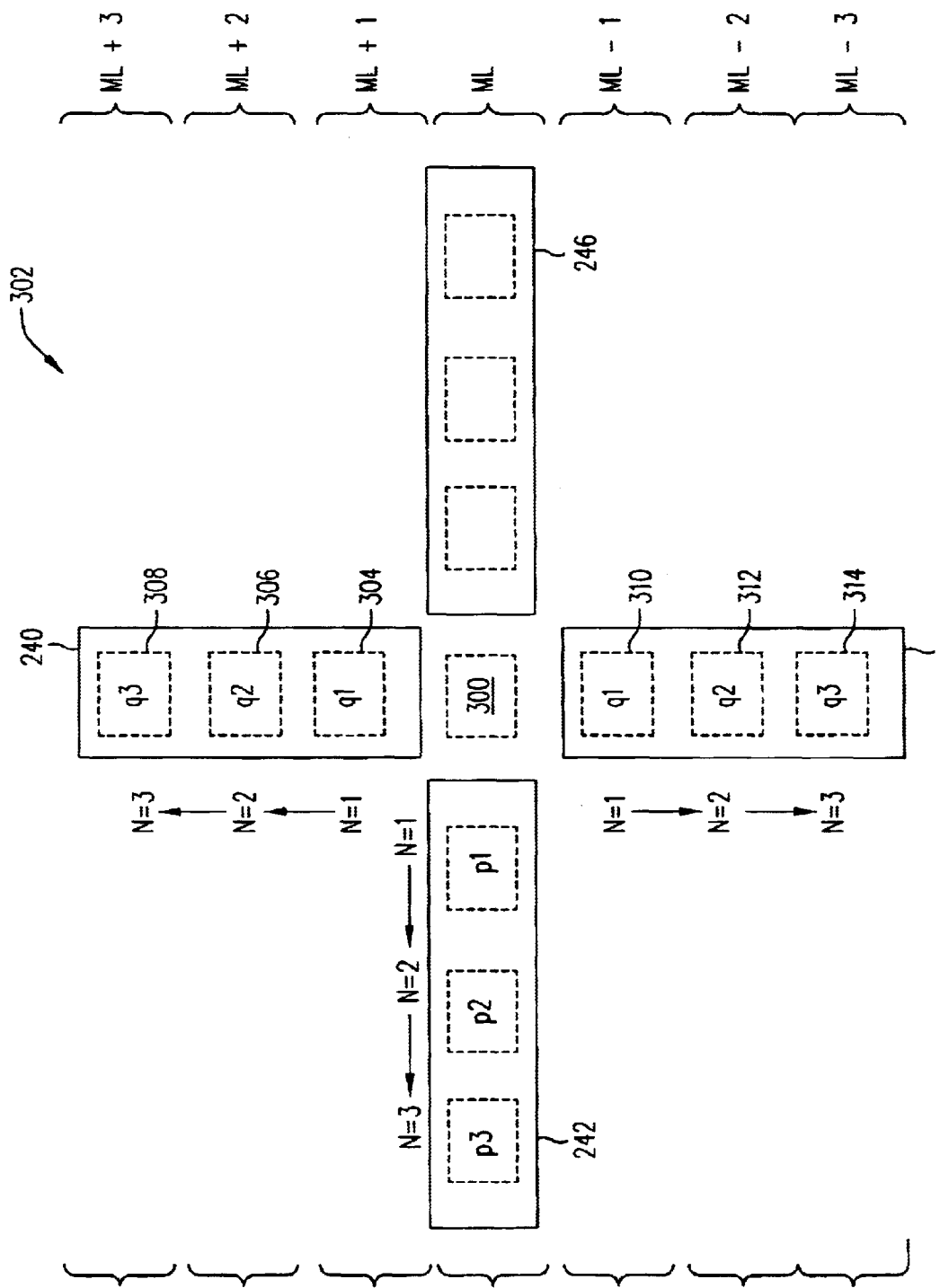
FIG. 12 is a block diagram illustrating the coupling vectors 240, 242, 244 and 246 computed to N=3 spacings from an estimated reference interconnect 300 at the pre-routing stage, according to some embodiments of the present invention.

FIG. 12 is a block diagram illustrating the probability of coupling vectors 240, 242, 244 and 246 computed to N=3 spacings from an estimate of the presence of a reference interconnect 300 at a pre-routing stage, according to some embodiments of the present invention. At the pre-routing stage, the locations of interconnects neighboring a hypothetical reference interconnect 300 are unknown; the coupling vectors for (which itself is not known to exist) reference interconnect 300 are therefore estimated based on probabilities. A reference interconnect 300 is assumed to exist, passing through a grid of interest (which is one of a number of grids in the grid matrix that are (e.g. sequentially) visited). Accordingly, the adjacency coupling vectors 242 and 246 (where N=3) may be defined as (p1, p2, p3), where p1 is the probability of the existence of an interconnect at N=1 (one spacing from the hypothetical reference interconnect 300), p2 is the probability of the existence of an interconnect at N=2 (and no interconnect at N=1), and p3 is the probability of the existence of an interconnect at N=3 (and no interconnects at N=1 and N=2).

Estimation of the probable existence of a given interconnect at N spacings greater than 1 (N>1) may be based on the probability of absence of any intervening interconnects between the given interconnect and the reference interconnect; this technique reflects the negligible capacitance effect that a parallel interconnect exerts from behind a second parallel interconnect that lies between it and the reference connect (in the same metal layer). In some embodiments of the present invention, a congestion map as described in reference to FIGS. 4 through 9 may be used during the pre-routing stage to estimate the coupling vectors (e.g., p1, p2 and p3) for each metal layer on a grid by grid basis. Assuming the congestion ratio (ratio of routing resource supply over routing resource demand) is p—wherein p is set to 1 if the congestion ratio exceeds 1—then given a reference interconnect, the probabilities p1, p2, p3 and p4 of the reference interconnect having an adjacent interconnect in the first (p1), second (p2), third (p3), and fourth (p4) spacing from the reference interconnect may be estimated using the formulae provided in Table 3.

TABLE 3

Adjacency Coupling Vector Estimation

| Dimensions | Estimation | Description |
| --- | --- | --- |
| N = 1 | p1 = p | Probability of interconnect routed in adjacent track (one spacing from reference interconnect) |
| N = 2 | p2 = (1 − p) p | Probability of interconnect routed in second track, but not in first track (two spacings from reference interconnect) |
| N = 3 | p3 = (1 − p)(1 − p) p | Probability of interconnect routed in third track, but not in first track or second track (three spacings from the interconnect) |
| N = 4 | p4 = 1 − (p1 + p2 + p3) | For wire coupling effect due to wire in fourth track away, and no wires in the first, second and third tracks (four spacings from interconnect) |

A general formula for estimating the existence of neighboring parallel interconnects up to N−1 spacings away from a given reference interconnect is provided by $p^N = (1-p)^{N-1} p$; estimation at N spacings away is the difference between 1 and the sum of the probabilities ($p1, p2 \ldots p^N$) calculated using the aforementioned general formula (illustrated by p4 in Table 3). Thus, where the adjacency coupling vector is estimated to N=3 spacings, the resulting 3-dimensional adjacency coupling vector (p1, p2, p3) will equal (p, (1−p)p, 1−(p+(1−p)p)). Note that the adjacency coupling vectors that estimate the probable existence of neighboring parallel interconnects to each side of a reference interconnect are identical as a matter of probability (in the pre-routing context), and therefore only one adjacency coupling vector needs to be calculated (as described above), and thereafter used for retrieving a capacitance value using a Table Look-Up Method.

Estimation of the upper-layer coupling vector 240 and the lower-layer coupling vector 244 is performed similarly to the adjacency coupling vector 242. In FIG. 12, upper-level coupling vector 240 computed to N=3 metal layers is illustrated relative to a reference interconnect 300, according to some embodiments of the present invention. Estimated reference interconnect 300 lies in metal layer ML, and upper-level coupling vector 240 computed to N=3 extends upward through three metal layers, labeled ML+1, ML+2 and ML+3 respectively. It should be noted that ML+1, ML+2 and ML+3 may be either a metal layer, the sky layer, or non-existent. The latter (non-existent) situation arises, for example, when the reference interconnect 300 lies in the uppermost metal layer of the metal layer structure, e.g., the fifth metal layer in a five layer metal layer structure; in this situation, ML is the fifth metal layer, ML+1 is the sky layer, and M1+2 and M1+3 are non-existent. In like manner, the lower-level coupling vector may have only a single dimension consisting of the ground plane layer.

Assuming the vertical congestion ratio (ratio of routing resource supply over routing resource demand for the vertical direction) is q—wherein q is set to 1 if the congestion ratio exceeds 1—then given a reference interconnect, e.g., 300, the upper-level coupling vector (q1, q2, q3) 240 estimated across N=3 metal layers ML+1, ML+2 and ML+3 may be computed in accordance with Table 4, according to some embodiments of the present invention.

TABLE 4

Upper- and Lower-layer Coupling Vectors

| Dimensions | Estimation | Description |
|---|---|---|
| N = 1 | q1 = MIN(1.0, z1 * s), | Value of layer coupling vector value for first layer away, wherein z1 = q if the layer track direction is orthogonal, and z1 = p if the layer track direction is parallel |
| N = 2 | q2 = MIN(1.0, (1 − q1) z2 * s) | Value of layer coupling vector value for two layers away, wherein z2 = q if the layer track direction is orthogonal, and z2 = p if the layer track direction is parallel |
| N = 3 | q3 = MIN(1.0, (1 − q1) (1 − q2) z3 * s) | Value of layer coupling vector value for three layers away, wherein z3 = q if the layer track direction is orthogonal, and z3 = p if the layer track direction is parallel |
|  | $q_{gp}$ = 1 − (sum of qN) | Value of layer coupling vector value lumped to ground plane layer |
|  | $q_{sky}$ = 0 | Value of layer coupling vector value lumped to the sky layer |

The formulas in Table 4 generally correspond to the formulas in Table 3. In Table 4, a shielding factor "s" is used to increase the layer coupling vector values in order to augment the capacitance values retrieved using the Table Look-Up Method. A recommended default value for the shielding factor "s" is 2; in general, the value of the shielding factor is derived empirically. One method for deriving "s" is by trial and error comparing the capacitance values estimated using, e.g., the method described in reference to Tables 3 and 4, and FIG. 12, with the actual capacitance measured from the already-routed IC chip (i.e., the actually routed device design). The Table 4 formulas in effect use the congestion ratios of the non-reference metal layers (the metal layers that do not include the reference interconnect) to estimate the likelihood of an interconnect running directly adjacent (immediately above or below) to a reference interconnect, e.g., interconnect 200, in successive layers from the reference interconnect.

The directly adjacent interconnects (in all layers) above and below a reference interconnect are hereafter referred to as "direct interconnects" for purposes of this disclosure. In addition to the capacitance effects exerted by the direct interconnects, however, other neighboring interconnects in the metal layers above and below the reference metal layer (e.g. interconnects within the same layer as neighbors of a direct interconnect) also exert a relevant capacitance effect on the reference interconnect. This situation may be illustrated in reference to metal layer M4 in FIG. 10, where neighboring interconnects 223, 225 and 227 exert an appreciable capacitance effect on the reference interconnect 200 (in addition the effect of direct interconnect 222). Depending on the example, a direct interconnect 222 may or may not be actually present, but is assumed to be present and its estimate of capacitance effect is computed for use with the shielding factor "s".

Referring to FIG. 12, the formulas in Table 4 provide an estimation of the likely existence of direct interconnects to be routed by the router—in the case of upper-layer coupling vector 240—in tracks 304, 306 and 308, and—in the case of lower-layer coupling vector 244—in tracks 310, 312 and 314. Thus, the Table 4 formulas omit the capacitance effects exerted by neighboring interconnects in the metal layers other than the direct interconnects. Accordingly, use of the Table Look-Up Method to retrieve the capacitance value for a layer coupling vector estimated merely on the basis of the direct interconnects—e.g., 304, 306 and 308 for upper-layer coupling vector—will result in an underestimation in the total capacitance effect exerted by the interconnects in metal layer M4. A shielding factor "s" is therefore used to compensate for this underestimation by increasing (as described above) the layer coupling vector values by a multiple of "s." In addition, the Table 4 formulas accommodate the capacitance effects exerted by the ground plane layer, and the absence of capacitance effects exerted by the sky layer above the topmost metal layer.

The use of the Tables 3 and 4 to estimate the adjacency and layer coupling vectors may be illustrated in reference to a grid in metal layers M1 and M2 in the typical five metal layer structure depicted in FIG. 1. For this example, the congestion ratio for the horizontal direction in the grid (metal layers M1, M3 and M5) is hypothetically assumed to be 0.8, and the congestion ratio for the vertical direction in the grid (metal layers M2 and M4) is assumed to be 1.5 respectively; these assumptions are designated as H=0.8 and V=1.5 respectively. In addition, the shielding factor "s" is assumed to be 2, and the coupling vectors are estimated to N=3 spacings. Starting with M1 (a horizontally directed metal layer), p is assigned H and q is assigned V; thus, p=0.8 and q=1 (q is set to 1 because the congestion ratio H (1.5) exceeds 1). For the adjacency coupling vector (p1, p2, p3), p1=0.8, p2=(1−0.8)0.8 and p3=1−(0.8+(1−0.8)0.8); therefore, the adjacency coupling vector (p1, p2, p3)=(0.8, 0.16, 0.04). For the upper-layer coupling vector (q1, q2, q3), q1=MIN(1, (1*2)=1, q2=MIN(1, (1−1) 1*2)=0, and q3=MIN(1, (1−1)(1−0)1*2)=0; therefore, the upper-layer coupling (q1, q2, q3)=(1, 0, 0). For the lower-layer coupling vector (q1, q2, q3), q1=ground plane layer=1, and q2 and q3 are non-existent, therefore the lower-layer coupling vector (q1, q2, q3)=(1, 0, 0).

Turning next to metal layer M2 (a vertically directed layer), p is assigned V and q is assigned H; thus, p=1 (p is set to 1 because the congestion ratio H (1.5) exceeds 1) and q=0.8. Switching the values of p and q while moving from M1 to M2 reflects the change in track direction between M1 and M2. The reason for this is that the adjacency coupling vector measures the parallel interconnect routing probabilities relative to a reference interconnect, and not relative to the direction (horizontal or vertical) of the reference interconnect; the layer coupling vectors likewise reflect the congestion of interconnects in surrounding layers, and not the directions of interconnects in the surrounding layers. Accordingly, for the adjacency coupling vector (p1, p2, p3), p1=1, p2=1(1−1), and p3=1−(1−0); therefore, the adjacency coupling vector (p1, p2, p3) is (1, 0, 0). For the upper-layer coupling vector (q1, q2, q3), q1=MIN(1, (0.8*2)=0.64, q2=MIN(1, (1−0.64)1*2)=1, and q3 =MIN(1, (1−0.64)(1−1)0.8*2)=0; therefore, the upper-layer coupling vector (q1, q2, q3)=(0.64, 1, 0). For the lower-layer coupling vector (q1, q2, q3), q1=MIN(1, 0.8*2)=0.64, q2=ground plane layer= 1−0.64=0.36, and q3 are non-existent, therefore the lower-layer coupling vector (q1, q2, q3)=(0.64, 0.36, 0). The p and q for remaining metal layers M3 through M5 are calculated in a similar manner.

Figure 13:
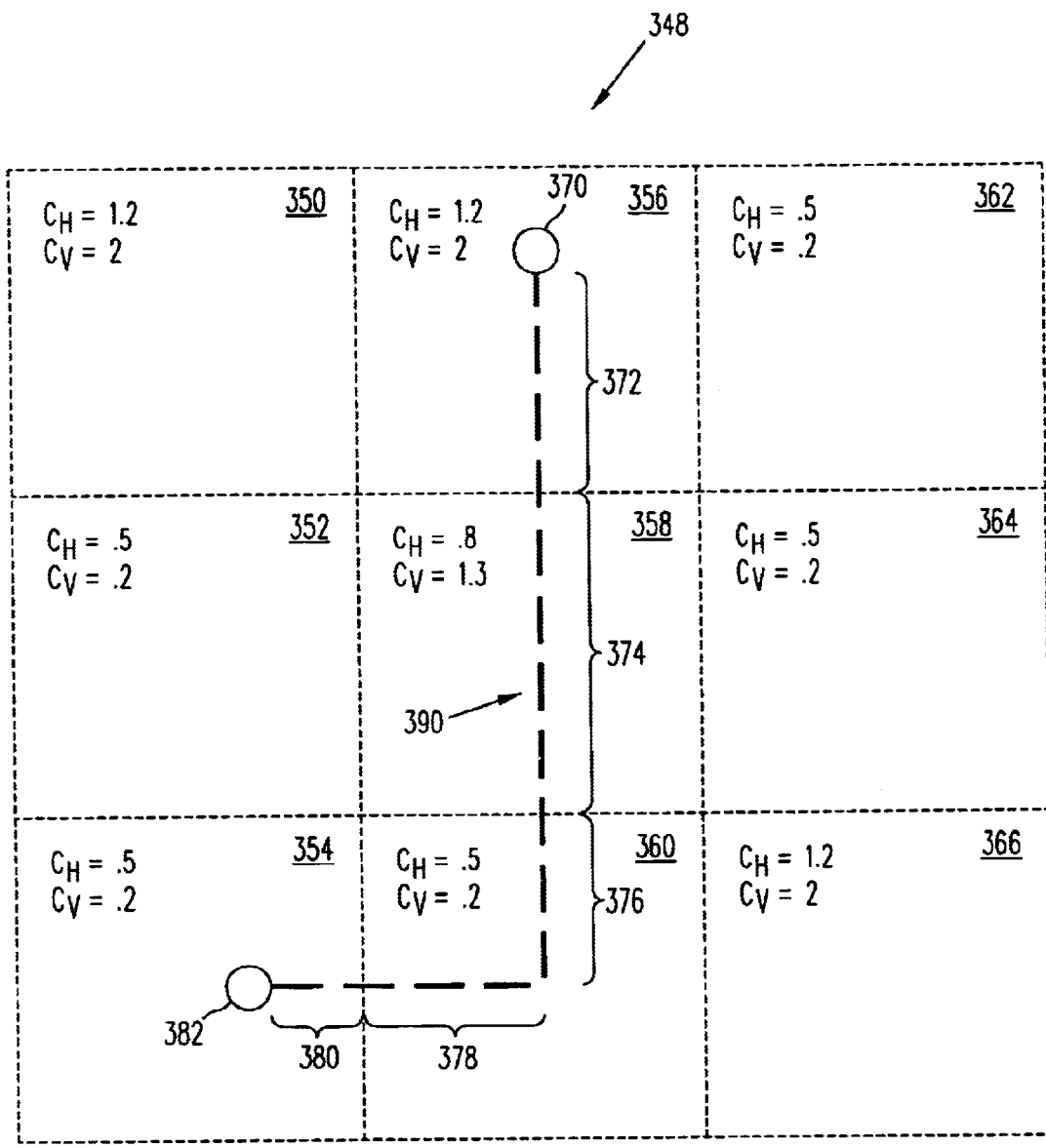
FIG. 13 is a block diagram illustrating a portion 348 of a resulting capacitance map and an exemplary two-pin net 390 positioned in the map, according to some embodiments of the invention.

Such coupling vectors are used to generate a map of capacitance. FIG. 13 is a block diagram illustrating a portion 348 of a capacitance map, and an exemplary two-pin net 390 positioned in the map, according to some embodiments of the invention. In FIG. 13, nine grids (350 through 366) of exemplary portion 348 of a capacitance map constructed in accordance with this disclosure is illustrated. Each grid has an associated $C_H$ and $C_V$ representing the estimated total capacitance effects C for interconnects (or segments of interconnects) passing through the grid in either the horizontal "H" or vertical "V" directions. The capacitance effects $C_H$ and $C_V$ are a function of the length of the interconnect segment passing through the grid; thus, for example, for an interconnect that passes entirely through a grid in the vertical direction, the entire capacitance effect $C_V$ is estimated to effect the interconnect segment. Estimating the capacitance effect in a net therefore includes determining the grids traversed by a net, and summing the respective capacitance effects associated with the particular interconnect segment lengths and directions in each of the aforementioned grids; this method is illustrated in reference to net 390 in capacitance map portion 348.

As illustrated in FIG. 13, net 390 consists of a horizontal segment and a vertical segment that traverses grids 354, 360, 358 and 356. The horizontal segment further consists of horizontal segment 380 in grid 354 and horizontal segment 378 in grid 360. The vertical segment further consists of vertical segment 376 in grid 360, vertical segment 374 in grid 358, and vertical segment 372 in grid 356. The total capacitance effect C is estimated as the sum of the segment portions in each grid. Thus, traversing the net from connective pin 382 to connective pin 370, the first line segment consists of horizontal segment 380 that traverses approximately 30% of the horizontal distance of grid 360. The capacitance effect $C_H$ for horizontal segment 380 is estimated accordingly as 0.3 multiplied by the $C_H$ for grid, which is e.g. 0.2; thus, the $C_H$ for horizontal segment 380 is estimated as (0.3)(0.2) or 0.06 (rounding numbers). In like manner, horizontal segment 378 traverses approximately 60% of grid 360, and therefore the $C_H$ for horizontal segment 378 equals 0.6 multiplied by the $C_H$ for grid 360, which is also e.g. 0.2; thus, the $C_H$ for horizontal segment 378 is estimated as (0.6)(0.2) or 0.12.

Again, in like manner, vertical segment 376 traverses approximately 50% of grid 360, and therefore the $C_V$ for vertical segment 376 equals 0.5 multiplied by the $C_V$ for grid 360, or 0.5; thus, the $C_V$ for vertical segment 378 is estimated as (0.5)(0.5) or 0.25. Vertical segments 374 and 373 are calculated similarly; thus, the $C_V$ for vertical segment 374 equals (1)(1.3)=1.3, and the $C_V$ for vertical segment 372 equals (0.7)(2)=1.4. The total capacitance for net 390 therefore equals the sum of the capacitances for each of the aforementioned horizontal and vertical segments 380, 378, 376, 374 and 372, or 0.06+0.2+0.25+1.3+1.4=2.96. In some embodiments, the unit of measurement for capacitance is specified by the IC designer, and is typically in pico-farads ($10^{-12}$ farads) or femto-farads ($10^{-15}$ farads). When the estimated capacitance exceeds the specification, appropriate steps may be taken by the router to reduce the capacitance (e.g. by routing through grids of lower congestion).

Figure 14:
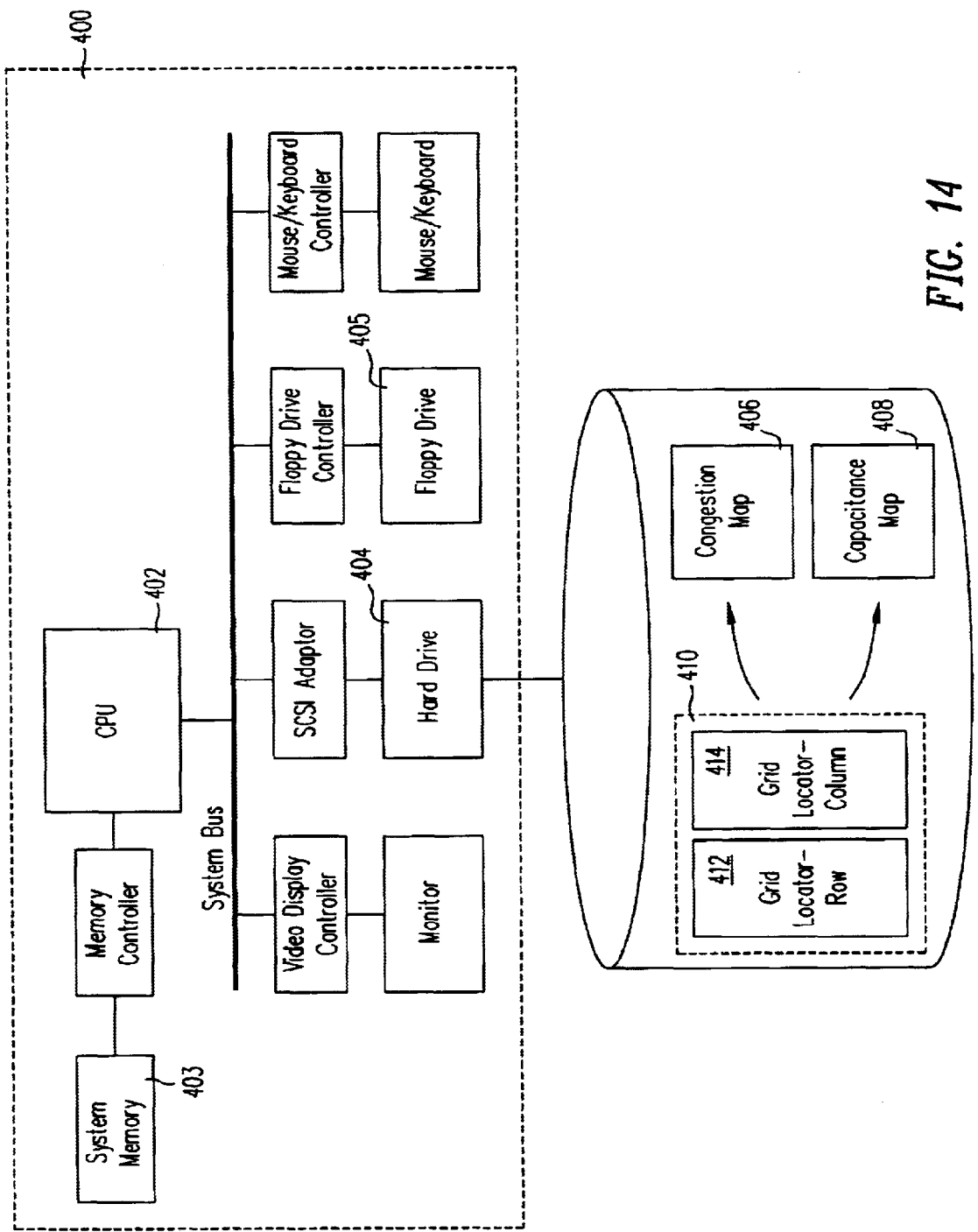
FIG. 14 illustrates, in a block diagram, a grid factor 410 for use with a congestion map 406 and a capacitance map 408 by computer 400 in one particular implementation.

The method of the present invention may be performed in either hardware, software, or any combination thereof, as those terms are currently known in the art. In particular, the present method may be carried out by software, firmware, or microcode operating on a general-purpose computer or computers or microprocessors of any type. FIG. 14 is a block diagram illustrating the principal hardware components of a general-purpose computer 400 compatible with some embodiments of the present invention. In particular, computer 400 includes at least one processor 402, a system memory (e.g., RAM or ROM) 403, and at least one computer-readable storage medium 404 (e.g., accessed by hard drive 405). In some embodiments of the present invention, computer-readable storage medium 404 is encoded with a data structure 408 representing a capacitance map for a particular IC design.

In some of these embodiments, capacitance map 408 is a two-dimensional array of records for storing and accessing the capacitance effects estimated for grids of a grid-matrix in accordance with the methods described in this disclosure. In some embodiments compatible with the present invention, the dimensions of the two-dimensional array representing the capacitance map correspond to the dimensions of the relevant grid-matrix, thereby facilitating access to the estimated capacitance effects for the grids (because the capacitance value for a grid is located at a position within the two-dimensional array corresponding to the position of the grid within the grid-matrix). In some embodiments compatible with the present invention, each record in the capacitance map array comprises two real numbers for storing the capacitance effects in the vertical and horizontal directions for each grid.

In yet other embodiments compatible with the present invention, computer-readable storage medium 404 is additionally encoded with a data structure 406 comprising a congestion map 408. In some of these embodiments, congestion map 408 is represented as a two-dimensional array of records for storing and accessing the congestion ratios estimated for the grids of a grid-matrix in accordance with the methods described in this disclosure. In some embodiments compatible with the present invention, the dimensions of the two-dimensional array representing the congestion map correspond to the dimensions of the relevant grid-matrix; this correspondence between the grid-matrix and congestion map facilitates access to the estimated congestion ratios for a particular grid because the capacitance value is located within the two-dimensional array in a position corresponding to the position of the grid within the grid-matrix. In some embodiments compatible with the present invention, each record in the capacitance map array comprises two real numbers for storing the congestion ratios in the vertical and horizontal directions for each grid.

In yet other embodiments compatible with the present invention, computer-readable storage medium 404 is yet further encoded with a data structure 410 for mapping the locations of the connective pins of the nets in the interconnect structure of the IC design to the corresponding grids within the grid-matrix. In some of these embodiments, each connective pin of a logical device is represented by a row number and a column number in a coordinate system defining locations on the interconnect structure of the IC design, a technique conventionally used in the art. In contrast to the grids of a grid-matrix, the rows and columns used to mark locations of the connective pins within the aforementioned coordinate system define areas of much finer granularity within the interconnect structure; a single grid thus includes multiple possible pin locations within the grid (not illustrated). Accordingly, in some embodiments of the present invention, the relevant congestion ratios and capacitance effects corresponding to various portions of the net defined by a set of connective pins are determined by identifying the relevant grids in which the portions of the nets are located; pin-to-grid data structure 410 is then used to map the portions of the net, including the connective pins, to the relevant grids. In some embodiments, data structure 410 includes two one-dimensional arrays 412 and 413, wherein a first array 412 provides a mapping of a connective pin location (row) to a corresponding row of the congestion map 406 and capacitance map 408, and a second array 413 provides a mapping of a connective pin location (column) to a corresponding column of the congestion map 406 and capacitance map 408. It should be noted that those skilled in the art will recognize that numerous, differing data structures may be used to implement different embodiments of the present invention. Moreover, the data structures may be encoded on the same storage medium that holds a description of the circuitry to be formed in the IC chip (e.g. in Verilog or VHDL).

Software embodying the present invention may comprise computer instructions in any form (e.g., source code, object code, interpreted code, etc.) stored in any computer-readable medium, e.g., 404–406 (for example, ROM, RAM, magnetic media, punched tape or card, compact disc (CD) in any form, DVD). Accordingly, the present invention is not limited to any particular computing platform.

While particular embodiments of the present inventions have been shown and described, it will be apparent to those skilled in the art that changes and modifications may be made without departing from this invention in its broader aspect and, therefore, the appended claims are to encompass within their scope all such changes and modifications as fall within the true spirit of this invention.

I claim:

1. A computer-implemented method for estimating capacitance effects in interconnects to be routed in an integrated circuit, using a design simulating the integrated circuit prior to the routing, the design comprising a plurality of metal layers in an area, the method comprising:
   retrieving from memory, capacitance effects for the area in each metal layer;
   retrieving from memory, interconnect densities for each metal layer;
   normalizing the interconnect densities for each metal layer; and
   multiplying the normalized interconnect density for each metal layer with the retrieved capacitance effect for the area in the corresponding metal layer.

2. The method of claim 1 wherein metal layers sharing a common interconnect direction are normalized as a group.

3. The method of claim 2 further comprising:
   summing the products of said act of multiplying, for metal layers sharing a common interconnect direction.

4. The method of claim 1 further comprising:
   summing the products of said act of multiplying, for metal layers sharing a common interconnect direction.

5. The method of claim 1 wherein the area corresponds to a grid in a grid-matrix.

6. The method of claim 1 wherein said act of multiplying is repeated for each of a plurality of areas substantially covering the design.

7. The method of claim 1 wherein the capacitance effects are retrieved from a database of predetermined values, using a probability that a reference interconnect has neighboring interconnects.

8. The method of claim 7 wherein:
   the neighboring interconnects are determined as coupling vectors.

9. The method of claim 8 wherein:
   the coupling vectors comprise an adjacency coupling vector, a lower-layer coupling vector and an upper-layer coupling vector.

10. The method of claim 1 further comprising:
    determining the probability using estimates of congestion among interconnects.

11. The method of claim 10 wherein:
    the determining is performed for neighboring interconnects routed within a predetermined number of tracks, in the same metal layer of the design, from the reference interconnect.

12. The method of claim 10 wherein:
    the determining is performed for neighboring interconnects routed within a predetermined number of metal layers from the reference interconnect.

13. A computer-readable storage medium encoded with a computer program, wherein the computer program comprises instructions for performing the acts of retrieving, normalizing and multiplying recited in claim 1.

14. A computer system for estimating capacitance effects in interconnects to be routed in an integrated circuit, using a design simulating the integrated circuit prior to the routing, the design comprising a plurality of metal layers in an area, the computer system comprising:
    means for retrieving from memory, capacitance effects for the area in each metal layer;
    means for retrieving from memory, interconnect densities for each metal layer;
    means for normalizing the interconnect densities for each metal layer; and
    means for multiplying the normalized interconnect density for each metal layer with the retrieved capacitance effect for the area in the corresponding metal layer.

15. The computer system of claim 14 further comprising:
    means for summing the products of said means for multiplying, for metal layers sharing a common interconnect direction.

16. The computer system of claim 15 wherein the capacitance effects are retrieved from a database of predetermined values, using a probability that a reference interconnect has neighboring interconnects, the computer system further comprising:
    means for determining the probability using estimates of congestion among interconnects.

17. The computer system of claim 14 wherein the capacitance effects are retrieved from a database of predetermined values, using a probability that a reference interconnect has neighboring interconnects, the computer system further comprising:
    means for determining the probability using estimates of congestion among interconnects.

18. The computer system of claim 14 further comprising:
    the memory which is encoded with values of capacitance effects.

19. The computer system of claim 18 wherein:
    the values of capacitance effects are held in a two-dimensional array;
    each element in said two-dimensional array maps to a corresponding area covered by an interconnect structure; and
    at least one value for each element in said two-dimensional array represents a capacitance effect generated within the corresponding area.

20. A computer-implemented method for estimating capacitance effects in interconnects to be routed in an integrated circuit using a design that simulates the integrated circuit prior to the routing, the method comprising:
    retrieving from memory, interconnect densities for each metal layer;

normalizing the interconnect densities, for each metal layer;

determining a probability that an interconnect hypothetically routed in a metal layer of the design has neighboring interconnects in an area;

using the probability obtained from said determining to retrieve from memory capacitance effects for each metal layer in said area;

multiplying the normalized interconnect density for each metal layer, with capacitance effect for said area in the corresponding metal layer; and summing the products of said act of multiplying for metal layers that share a common interconnect direction.

21. The method of claim 20 wherein:
the act of determining the probability uses estimates of congestion among interconnects.

22. The method of claim 20 wherein said act of multiplying is repeated for each of a plurality of areas substantially covering the design.

23. The method of claim 20 wherein:
the neighboring interconnects are determined as coupling vectors.

24. The method of claim 23 wherein:
the coupling vectors comprise an adjacency coupling vector, a lower-layer coupling vector and an upper-layer coupling vector.

* * * * *

UNITED STATES PATENT AND TRADEMARK OFFICE
CERTIFICATE OF CORRECTION

PATENT NO. : 6,618,846 B2
DATED : September 9, 2003
INVENTOR(S) : Cheng

It is certified that error appears in the above-identified patent and that said Letters Patent is hereby corrected as shown below:

Column 21,
Line 65, "The method of claim 1 further comprising" should be -- The method of claim 7 further comprising --.

Signed and Sealed this

Thirty-first Day of August, 2004

JON W. DUDAS
*Director of the United States Patent and Trademark Office*